United States Patent [19]

Keane

[11] 3,921,085

[45] Nov. 18, 1975

[54] FREQUENCY DISCRIMINATOR APPARATUS

[76] Inventor: William J. Keane, 3599 Ensalmo Ave., San Jose, Calif. 95118

[22] Filed: Nov. 23, 1973

[21] Appl. No.: 418,232

[52] U.S. Cl. ................ 329/116; 325/446; 329/122; 331/3; 331/23; 333/1.1

[51] Int. Cl.[2] ............................................ H03D 3/00

[58] Field of Search ........... 329/110, 116, 122, 119, 329/200; 331/3, 13, 25, 36 L, 36 R, 182; 325/446; 333/1.1, 24.1

[56] References Cited

UNITED STATES PATENTS

| | | | |
|---|---|---|---|
| 3,364,430 | 1/1968 | Goodman et al. | 329/116 |
| 3,382,452 | 5/1968 | Rempel et al. | 331/3 |
| 3,406,353 | 10/1968 | Mueller | 331/25 X |
| 3,622,896 | 11/1971 | Pircher | 329/116 |

*Primary Examiner*—Alfred L. Brody
*Attorney, Agent, or Firm*—Limbach, Limbach & Sutton

[57] ABSTRACT

A frequency discriminator having a bandwidth variable from a relatively narrow range to a very wide range in which the center frequency is simultaneously tunable over an extremely wide frequency range. The discriminator is insensitive to amplitude variations of the input signal and is capable of demodulating low level signals. The frequency discriminator is particularly useful for microwave frequency applications wherein the basic discriminator element is a ferrimagnetic resonator. The frequency discriminator forms a portion of several preferred embodiments including devices for the frequency control of signal sources, frequency measurement of signal sources, demodulation of frequency modulated signals and frequency tracking control for other ferrimagnetic devices.

26 Claims, 29 Drawing Figures

FREQUENCY DISCRIMINATOR APPARATUS

BACKGROUND OF THE INVENTION

This invention relates to frequency discriminators and their applications and particularly to a frequency discriminator having a variable bandwidth over a wide range in which the center frequency is simultaneously tunable over an extremely wide bandwidth and various devices embodying the discriminator. Although the invention is particularly useful in microwave frequency applications it is not limited to such uses. Also, while the preferred embodiments disclosed herein typically employ ferrimagnetic resonators, such as YIG (yittrium-iron-garnet), other elements having similar characteristics may be used subject to the performance characteristics of such other elements.

Center frequency turning of prior art resonant circuit discriminators consists of basically two different types: mechanically or electrically turned center frequency. Both types use either the amplitude or phase versus frequency characteristics of a single or dual resonant circuit to indicate the frequency of the input signal relative to the discriminator center frequency. In the amplitude comparison mode, a dual mode resonant circuit is preferred with dual detectors. In the phase comparison mode, a single resonant circuit is often sufficient with dual detectors used to convert phase to amplitude. The output of such prior art discriminators is very sensitive to the amplitude of the input signal, and they require critical and expensive means to lessen such amplitude dependence.

Because of the amplitude comparison between dual detectors required in prior art approaches, improving the discriminator's capability to detect low level signals is only possible by introducing signal gain at the carrier frequency. The critical problems of tracking detectors over a wide dynamic range and the need for tracked high gain video amplifiers makes amplification after detection impractical.

The bandwidth of the prior art discriminators is generally fixed by the loaded Q of the resonant circuit and/or the circuit coupling factors in the case of dual mode resonators. In many applications, compromises must be made between the desired discriminator bandwidth, linearity and resolution. For example, a wide bandwidth is often desirable to ensure that the input frequency falls within the discriminator range; while a narrow bandwidth is desirable to provide the best possible frequency resolution. It is also difficult to achieve wide bandwidths and good linearity simultaneously because of the phase and amplitude non-linearity of the resonant circuit. Another characteristic of the prior art discriminators is the difficulties in achieving a wide turning range of the center frequency. The limitations of mechanically tuned circuits are due to the fact that physical dimensions have to be changed and often multiple resonant circuits must be tracked to maintain constant discriminator bandwidth. In the microwave frequency region, this limitation has been overcome to some extent by substituting ferrimagnetic cavities that can be electronically tuned over a wide bandwidth. Thus, yittrium-iron-garnet (YIG) discriminators have been built in the manner of Nathanson (U.S. Pat. No. 3,274,519) using amplitude comparison or Goodman et al (U.S. Pat. No. 3,364,430), Hoover et al (U.S. Pat. No. 3,562,651) and Pircher (U.S. Pat. No. 3,622,896) using phase characteristics of YIG resonator. In the dual mode amplitude comparison approaches, center frequency turning range is limited by ability to divide input amplitude equally between two cavities and the ability to track cavities to maintain a constant bandwidth. In the phase reference approach, the center frequency range is limited by the bandwidth of broadband phase shift networks necessary to establish proper phase reference and the ability to equally divide input power. Current practice limits center frequency tuning range to about a single octave.

Both YIG discriminator approaches have narrow, fixed bandwidth characteristics whose output voltage versus input frequency slope is sensitive to input signal amplitude and center frequency changes, and whose linearities are difficult to maintain because of impedance mismatches and spurious resonant modes in the ferrimagnetic resonator. Both discriminator types require dual detector outputs and expensive and bulky ancilliary microwave components; both require extensive critical alignment to cover wide tuning range with near constant discriminator slope.

In the specific prior art approaches applied to automatic frequency control, a single, fixed center frequency mechanically tuned cavity has been used to stabilize the frequency of high frequency generators. In one method of approach for this application, a cyclical mechanical modulation of the center frequency of the cavity has been used to sense the position of the generator frequency relative to the cavity center frequency and provide a correction signal to control the generator. The purpose of this approach was to use the superior mechanical stability of the cavity to stabilize the frequency of the generator. The cavity was tuned sinusoidally by mechanical means and the rate of tuning was limited to slow variations inherent in mechanical variations of the cavity. The application of the present invention in automatic frequency control is to vary the center frequency of the generators by tracking them to the variable center frequency of the discriminator. Bandwidth adjustments on the discriminator can be made to facilitate the initial capture of the generator and then to maximize the frequency resolution. The sample rate of the discriminator is electronically controlled and can be optimized to match the desired tuning rate of the generators.

SUMMARY OF THE INVENTION

It is the general object of the present invention to provide a frequency discriminator whose bandwidth and center frequency can be tuned electronically. The discriminator slope will be insensitive to input signal amplitude or changes in center frequency. The linearity of the discriminator will be maintained for both wide and narrow bandwidths and the center frequency of the discriminator can be tuned over multi-octave frequency ranges. This discriminator will also be able to demodulate low level signals by using high gain amplification after crystal detection.

Another object of this invention is to provide a low cost discriminator to demodulate frequency modulated voice or data communications.

Another object of this invention is to provide a wide tuning range discriminator to control the frequency of a multiple number of oscillators or the output of a harmonic generator.

Another object of this invention is to overcome the sensitivity and inability to operate properly in the presence of multiple signals of heterodyne converters used for frequency measurement.

Another object of this invention is to provide a wide tuning range discriminator that can simultaneously measure and/or control the center frequency, deviation and deviation linearity of microwave sources.

Another object of this invention is to provide a means which can be incorporated with other ferrimagnetic components to close-loop track them to a particular input signal.

A frequency discriminator is provided including an electronically tunable resonant circuit, such as a YIG resonator and a detector connected to the resonator output. The band or spectrum of frequencies containing the input signal or signals of interest are linearly swept by the resonator circuit. The relative position of the detector output is then compared with the sweep waveform to provide the discriminator output. Since the relative position of the detected output does not change as a function of the input signal level, the discriminator slope is independent of signal amplitude. The sweep rate of the resonator must provide at least two samples within one period of the frequency of the highest modulation component in order to accurately demodulate the information. For a non-modulated carrier, frequency can be determined in a single sweep.

The resonator may be used in either a band-pass or band-reject mode and several advantages accrue for each in particular applications. In the case where a ferrimagnetic resonator is used as the resonant element, the center frequecy of the discriminator can be readily changed by controlling the current through an electromagnet. The sweeping signal can then be superimposed on the center frequency tuning current to generate a sweep of the resonator. Preferably, however, an auxiliary air core inductor is used to superimpose a variable magnetic field across the resonator. By using an air core inductor, the resonator can be swept without magnetic hysteresis or saturation and at much faster rates than would be possible through the electromagnet. Since the ferrimagnetic resonator tunes linearly with magnetic field, a very high degree of discriminator linearity is achievable by using a linear current driving source. The bandwidth of the discriminator can be controlled very accurately from a few MHz to several hundred MHz by changing the magnitude of the current drive. In most of the preferred embodiments disclosed herein, the sweeping filter alternative is used; however, it is to be understood that with suitable modifications within the ordinary skill in the art that the filter can be fixed and the frequency of the signal can be linearly swept in like fashion creating outputs equally suitable in several embodiments.

These and numerous other advantages of the present invention will become apparent as the following detailed description and accompanying drawings are read and understood.

DESCRIPTION OF THE PREFERRED EMBODIMENTS

Figure 1:
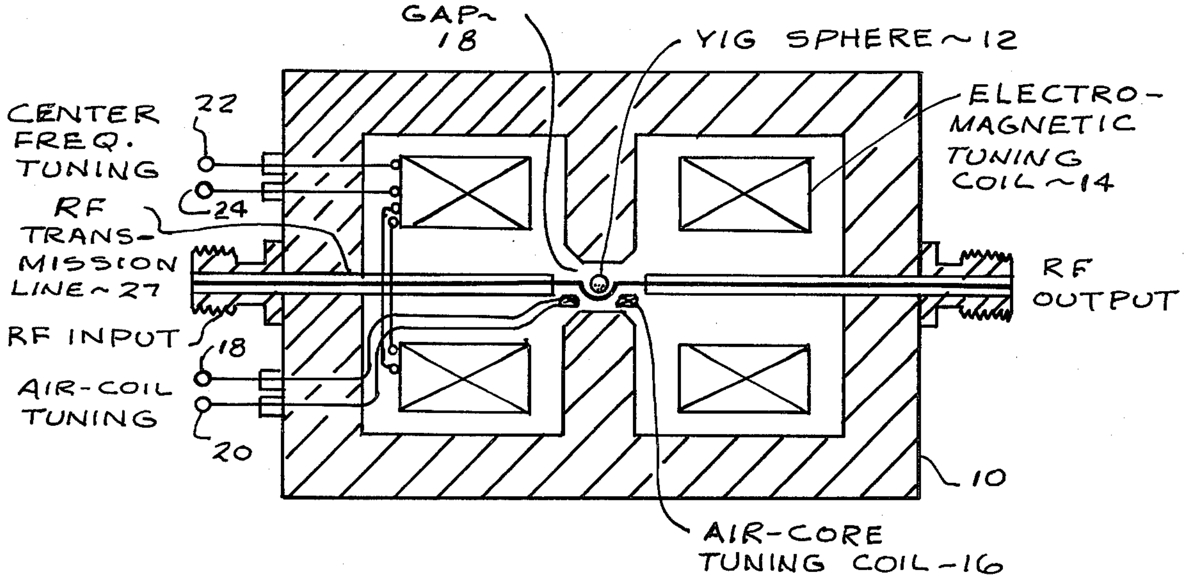
FIG. 1 is a cross-sectional view of an exemplary YIG resonator assembly including a magnetic housing, YIG sphere and electromagnetic and air tuning coils for use in a frequency discriminator according to the present invention.
Figure 2:
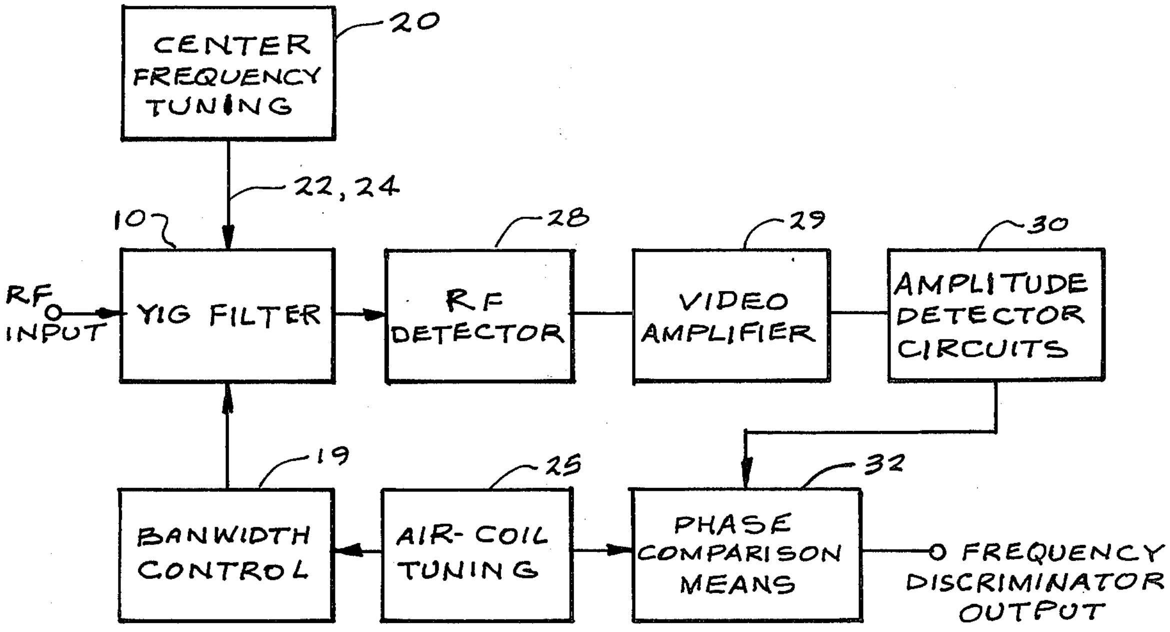
FIG. 2 is a block diagram of an embodiment of the frequency discriminator according to the present invention.

Referring first to one basic preferred embodiment of the frequency discriminator according to the present invention as shown in FIGS. 1 and 2, wherein FIG. 1 shows in cross section a YIG filter 10 which is usable to the block diagram of FIG. 2. The YIG filter 10 includes a single resonator YIG sphere 12 whose center frequency is tuned by means of an electromagnet tuning coil 14 (shown in cross section) as a function of the electromagnet 14 tuning a current, and a small air coil 16 which surrounds the YIG sphere 12 in the electromagnet gap 18. As explained further hereinafter, the air coil 16 is driven by a periodic waveform that displaces the resonant frequency of the YIG filter cavity by an amount on either side of the quiescent frequency proportional to the current in the coil set by bandwidth control 19. The advantages of an air coil (although the same effect is possible by scanning in a periodic waveform into the main tuning part of the electromagnet) are: the offset is zero, i.e., if there is no current in the coil 16 there is no effect on the YIG 12 resonance; the time constant is considerably smaller because the inductance of coil 16 is less and an air core coil has no magnetic time constant, consequently, the resonance can be tuned faster; and an air coil core does not exhibit magnetic hysteresis or saturation, thereby insuring a linearity and slope independent of center frequency tuning.

Figure 3:
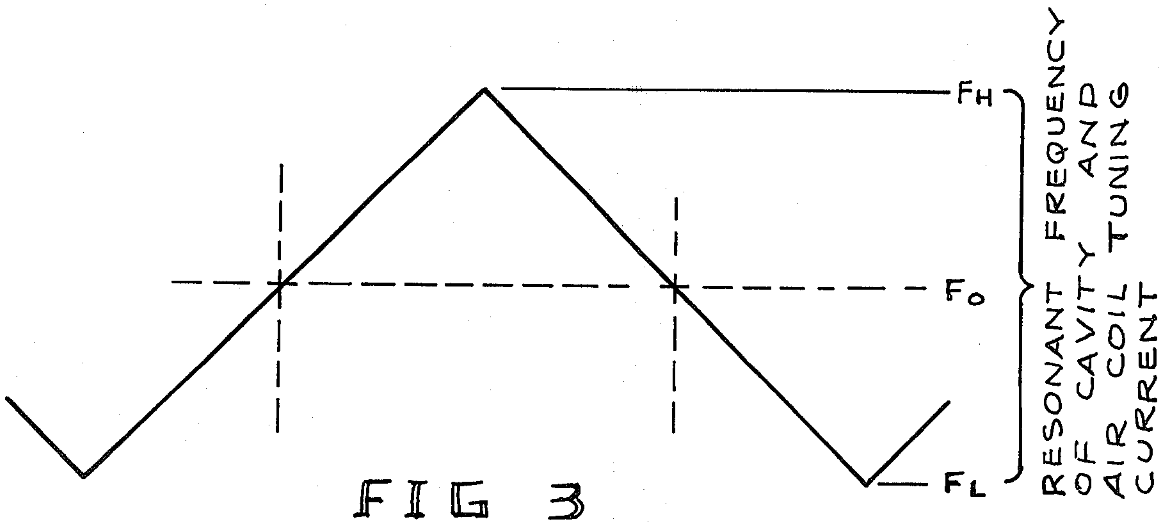
FIG. 3 is a graphic presentation of a cyclic current waveform suitable for tuning the air coil of FIG. 1.

The center frequency tuning source 20 applied to the electromagnet tuning coil 14 on lines 22 and 24 sets the center frequency operation for the YIG filter 10. The center frequency tuning source 20 provides a current for driving the electromagnet tuning coil 14. The current could be made proportional to frequency so that a fixed level input signal sets the center frequency of the discriminator to a fixed frequency or, alternately, the control current could be continually swept so that the center frequency of the discriminator is continually tuned. It will be apparent that the nature of the control current for center frequency tuning of the YIG filter 10 may be varied depending on the application in which the discriminator is to be used. At the same time that the center frequency tuning source 20 is operating, the air coil 16 is being tuned by an air coil tuning source 25 with a cyclic current as shown in FIG. 3.

The shape and generation of the driving waveforms can be of a variety of forms. They, in fact, can be shaped to provide a particularly desirable transfer function for the discriminator. It is only important to control the driving waveform so that its position is known at a particular time with respect to some reference timing position. All of the information needed to generate a discriminator waveform is included in a single sweep from the lowest frequency $F_L$ to the highest frequency $F_H$. If, as is commonly required, the desired discriminator curve is linear, then the resonator tuning should be linear.

The amplitude of the tuning current to the air coil 16 which is set by the bandwidth control 19, determines the extent that the YIG resonance is tuned off its quiescent (or $F_o$) value. Therefore, by varying the amplitude of the drive current in 19, the width of the resonance sweep can be readily adjusted. As explained further below, this is equivalent to varying the bandwidth of the discriminator. Typical variations of bandwidth could be ±400 MHz to as low as ± a few MHz. This capability is extremely important and is not characteristic of prior art frequency discriminators.

To this point the drive currents for the YIG 12 resonator have been described. The drive is made up of two parts: (1) the bias or center frequency tuning to the electromagnet tuning coil 14 which controls the quiescent or $F_o$ value, (2) the cyclical delta F (ΔF) tuning from $F_L$ to $F_H$ the amplitude of which can be varied to vary the width of the YIG resonator and therefore the bandwidth of the discriminator.

Alternately, the bias tuning could be provided by a permanent magnet, a mechanical variation of the magnetic gap or any combination of electrical and permanent magnet biasing. The cyclical magnetic field can be introduced at rates from DC up to several MHz.

As the YIG resonator is tuned across the ΔF range with a controlled sweep waveform, the position in the sweep where the resonator is tuned to a particular frequency must be sensed. In order to accomplish this, the YIG resonator is coupled to a transmission line 27 in such a way that the amplitude of a signal on this line within the ΔF range is amplitude modulated by the resonant YIG cavity 12. The YIG resonator can be coupled into the transmission line in either a band-pass or a band-reject mode. In the band-pass mode the RF detector 28 is coupled to the output of the transmission line 27 and as the tuning of the resonator approaches the RF signal frequency the amplitude of the RF detector increases. In the band-reject mode, shown in FIG. 1, the detector 28 is coupled to the transmission line 27 and as the tuning of the resonator 12 approaches the RF signal frequency the amplitude of the RF detector 28 decreases. The choice of coupling will be determined by the particular application; the principle of operation is the same.

For maximum resolution, it is important that the loaded Q of the resonator be as high as possible within practical limits. This means that the unloaded Q of the resonator is maximized, that all cavity and coupling losses are minimized, and that the cavity is loosely coupled to the output.

Figure 4:
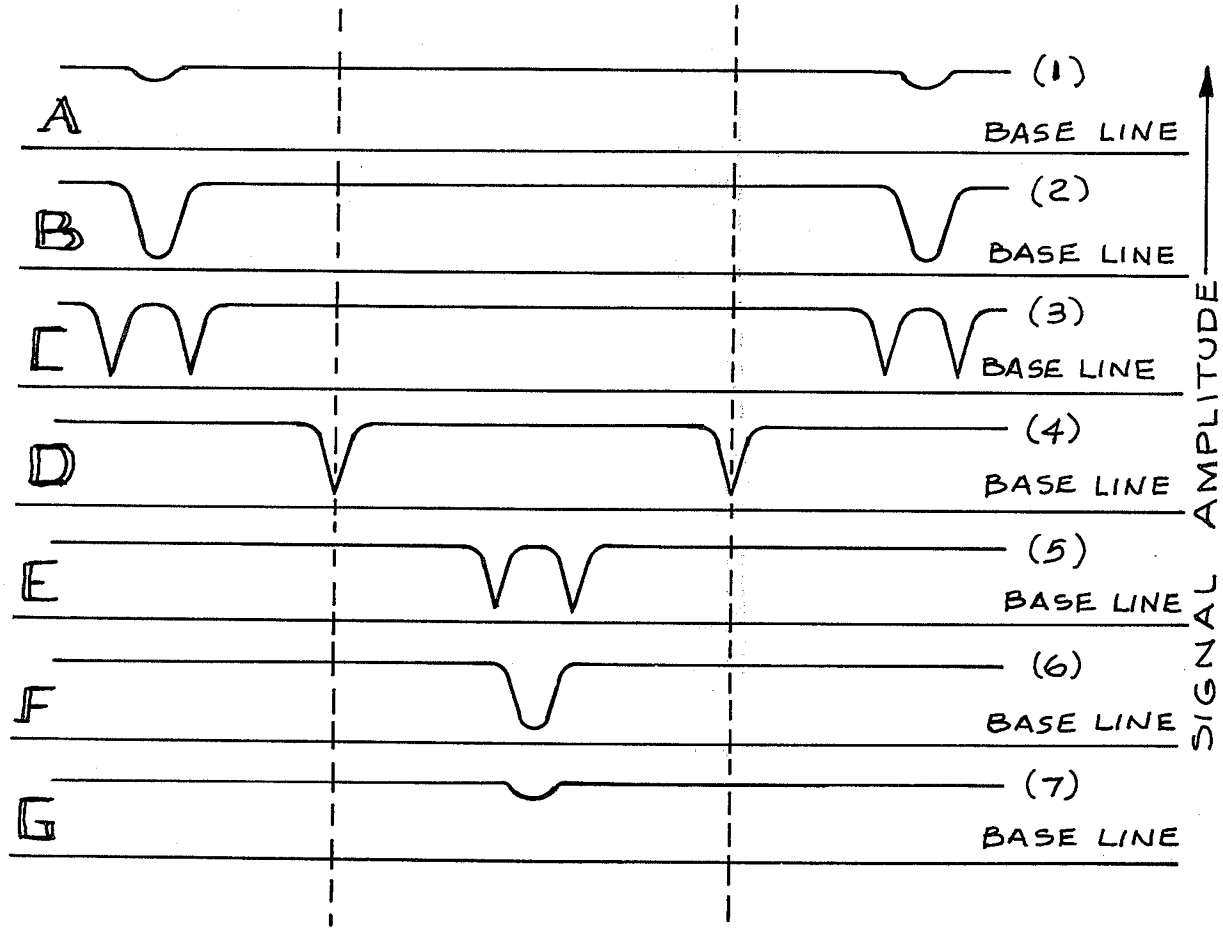
FIGS. 4A – 4G relate to FIG. 3 and are graphic presentation of a series and of waveforms illustrating typical outputs from the YIG resonator of FIGS. 1 and 2 when the resonator is operated in a band-reject mode as the air coil tuning current tunes the resonator frequency from $F_L$ to $F_H$.

FIG. 4 shows waveforms illustrating typical outputs when the YIG resonator is arranged in a band-reject mode. The outputs indicated occur as the input frequency is turned from $F_L$ to $F_H$.

In FIG. 4A the signal frequency is just barely below the frequency $F_L$. Therefore only a small portion of the resonance amplitude change is detected. In FIG. 4B the signal frequency is at the $F_L$ frequency and the amplitude response reaches a peak value. In FIG. 4C the signal frequency falls within the ΔF range and therefore it is detected twice; once on the positive slope and once on the negative slope. In FIG. 4D the signal frequency is at the center of the sweep, $F_o$. The resonance peak is equally spaced on both the negative and positive slopes from the sweep extremes.

FIGS. 4E, 4F and 4G repeat the same sequence except that they recur inverse to FIGS. 4A, 4B and 4C.

Therefore, if only one peak occurs during the triangular sweep, the signal is at either $F_L$ or $F_H$. Exactly where is readily indicated by determining the time in the sweep they occur. It is important to note that all of the necessary phase information is located on either the positive or negative slope. The second slope contains redundant information. Since the YIG resonance is directly proportional to the changing magnetic field of the air coil caused by the tuning current, if the current is linear the resonance point moves linearly over the entire ΔF range. Therefore, the exact position of the resonance gives an exact measure of the offset of the signal frequency from the quiescent frequency ($F_0$) when the air coil tuning coil current is zero.

This linear discriminator characteristic is in sharp contrast to more conventional discriminators which consist of multiple diodes tuned to different resonant circuits which are subtracted from one another. The resultant discriminator curve is quite non-linear, particularly at the extremes of the bandwidth.

Referring again to the block diagram of FIG. 2, the RF detector output is amplified in video amplifier 29 and coupled to an amplitude detection circuit 30 which processes the peaks or dips in the RF detector 28 output amplitude. The amplitude detector circuit 30 output is applied to a phase comparator 32 which also receives an input from the air coil tuning current source 25. The output of phase comparator 32 is the frequency discriminator output. Preferred embodiments for processing the RF detector amplitude and comparing its phase to the air coil tuning sweep to generate the conventional discriminator characteristic are described in later sections.

Another substantial advantage of this discriminator is that it is theoretically independent of signal level. Frequency is indicated by comparing the time difference (or phase) of the peak of the resonance curve to the sweep waveform in phase comparator 32.

Figure 5:
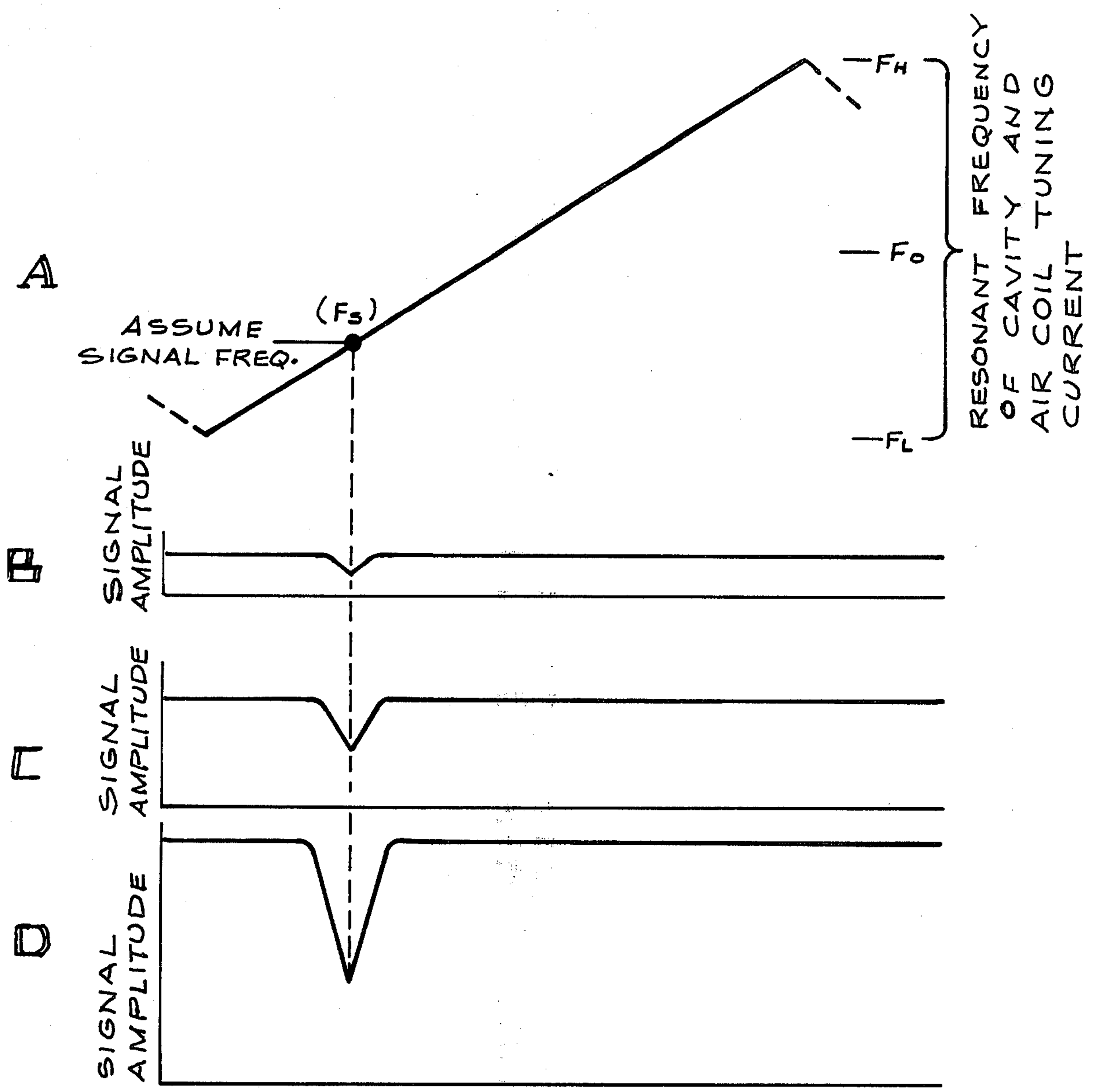
FIGS. 5A – 5D are a series of waveforms illustrating that the position of the peaks as in FIGS. 4A – 4G are independent of input signal level.

FIG. 5A indicates that the position of the peak is independent of the signal level. As the amplitude of $F_S$ increases, the output signal amplitude from RF detector 28 also changes as shown in FIGS. 5B, 5C and 5D, however, the phase or the relative timing of the peak of the resonance to the sweep waveform is unchanged. Therefore, the discriminator output is theoretically independent of input signal amplitude. A practical consideration, however, is the thermal heating of the YIG resonator at higher power levels (typically greater than 1 milliwatt). If the YIG sphere 12 is not oriented on the zero temperature axis, there will be a transient reduction or change of the anisotropic field in the YIG material which can alter the resonant frequency. This effect can be reduced to an insignificant amount if the YIG sphere 12 is oriented on its internal zero temperature drift anisotropic axis.

The performance of a microwave frequency discriminator according to the present invention may be contrasted to the performance of typical prior art frequency discriminators whose output is a function of input amplitude and therefore normally require limiters to maintain a constant discriminator slope. In contrast, this new discriminator technique is independent of input signal level and since there is only one detector there are no detector or amplifier tracking problems. Also, since the sweeping resonator is basically a sample system, a DC amplifier is not necessarily required.

Because of the single channel signal processing, this new discriminator offers a significant advantage in applications where it is necessary to demodulate or control low level signals. Prior art discriminators, using single or multiple detectors, whose discriminator slope was a function of absolute or compared amplitudes, require system gain at RF prior to detection for increased sensitivity. The non-linearities of the detectors, the difficulties of tracking these detectors over a wide dynamic range, the difficulties in tracking high gain amplifiers after RF detection and the need for amplitude limiting, or at least sensing at RF, precluded the possibility of improving signal sensitivity with post-detection amplification. These limitations are not present in this invention and a 30 to 40 db improvement in sensitivity is possible over prior art discriminators. For a wide tuning range discriminator, e.g. covering a 1 to 12.4 GHz tuning range, the cost savings in RF amplifiers is very considerable.

In the novel discriminator of FIG. 2, a video or log video amplifier 29 of standard design following the RF detector 28 can be used to increase the sensitivity. In this manner the discriminator can achieve sensitivites that are typically accomplished with standard crystal video receivers that are used for amplitude or pulse modulation detection. RF preamplification can also be added prior to the RF detector 28 or YIG filter 10 if additional signal sensitivity is required.

Another unique feature of the discriminator according to the present invention is that the bandwidth can be readily varied from a few MHz to several hundred MHz. This is accomplished by varying the amplitude of current driving the air coil 16 of FIG. 1. The lower limit is set by the loaded Q of the resonator: as the scan is decreased the peak of resonance is more difficult to sense. The upper limit is set by the maximum amount of current that can be forced through air coil 16 until there is damage to the coil or YIG sphere 12 due to thermal effects.

The bandwidth variation of this new discriminator, over a range of 100:1 or better, is in sharp contrast to the fact that prior art microwave discriminators (including YIG types) do not have any capability to vary their bandwidth electronically. In contrast to conventional YIG tuned discriminators, the maximum bandwidth is about ten times wider than can currently be achieved.

The discriminator of this invention can, therefore, provide the widest possible bandwidth for capturing or measuring a signal frequency and yet also provide the narrowest bandwidth for maximum resolution and highest tuning slope. Both wide and narrow band operation retain the excellent linearity characteristics and insensitivity to signal amplitude variations.

Under one principal embodiment, operation depends on a tunable resonant cavity which is not limited to a YIG cavity, and whether a band-reject or band-pass cavity is used depends on the application — whether a single pole or multiple pole filter is used also depends on the application.

Certain unique properties of the discriminator according to this invention are best understood by the examination of the transfer characteristic of the detector in the presence of multiple signals. Theoretically, the RF detector 28 (FIG. 2) can rectify input signals over the entire frequency range from a few MHz to above 26 GHz. In practice, however, a DC return for the crystal input and an RF bypass and the output limit the range somewhat. Nevertheless, it is important to note that the freqency range of the discriminator is not limited by the RF detector 28 in any theoretical way.

Figure 6:
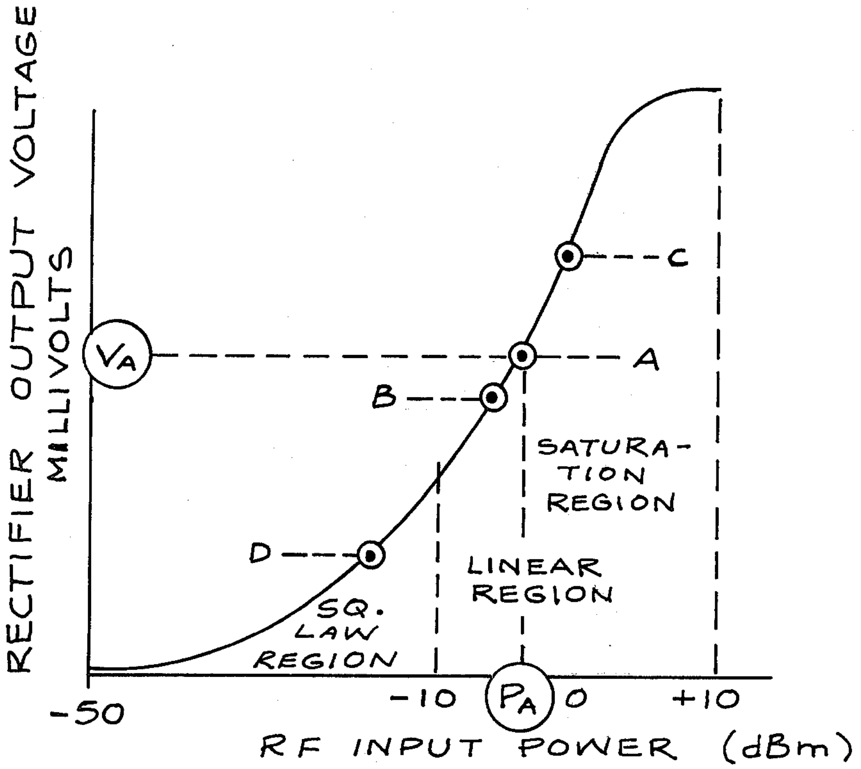
FIG. 6 is a graphical presentation showing the effect of multiple signals on a non-linear detector.

Referring to FIG. 6, which shows a typical detector curve of input power versus rectified output voltage, and neglecting any mixing products generated by multiple signals in the non-linear detector, the rectified output is affected as follows:

If an input signal of frequency falling within the range of the detector is incident on the detector with power equal to ($P_A$), then the rectified output voltage from the detector will be ($V_A$).

If a signal of level A and a signal of level B are simultaneously applied to the detector, then the rectified output voltage will be equal to a voltage corresponding to a signal of power $P_A+P_B$. If the signals are of equal power then, in square-law region, the output voltage will double; in the linear region, the output voltage will increase about 1.4 times; in the saturated region it is possible that there will be no increase in output voltage.

If a signal of level A and a signal of level D are applied to the detector the output voltage will correspond to an input power of $P_A + P_D$. If $P_D \leq$ 10 db of $P_A$, there will be at most a 10 percent change in $V_a$ with the introduction of signal D. If $P_D \leq$ 20 db of $P_A$, there will be at most a 1 percent change in $V_a$ with the introduction of signal D. Therefore, it is practical to say that the output voltage from RF detector 28 is virtually independent of signal D.

If a signal of level A and a signal of level C are applied to RF detector 28, and if signal C is 20 db more power than signal A, likewise the output voltage will be primarily due to C. Signal A will have only a 10 percent effect on the output voltage.

In the case of a band-reject cavity, the response of the detector to multiple signals leads to several interesting properties for the novel discriminator according to this invention.

The discriminator will provide an output only for the largest input signal, if the largest signal is about 10db above any other residual signal. Therefore, for example, if the discriminator is used to control an oscillator, it will automatically lock onto the fundamental output as long as harmonics are suppressed by greater than 10db. Also, if the input signal has other spurious signals greater than 10db down, the discriminator will select the desired input. Thus, the presence of the input signal will be detected by the discriminator, as it is scanned through the entire frequency range, only for the largest RF signal amplitude in the range.

This is in direct contrast to more conventional cavity discriminators, which have no easy way to distinguish the desired signal from other spurious signals. This is particularly the case when the input signals can extend over a very wide frequency and amplitude dynamic range (e.g. 20 GHz and greater than 40db respectively).

Figure 7:
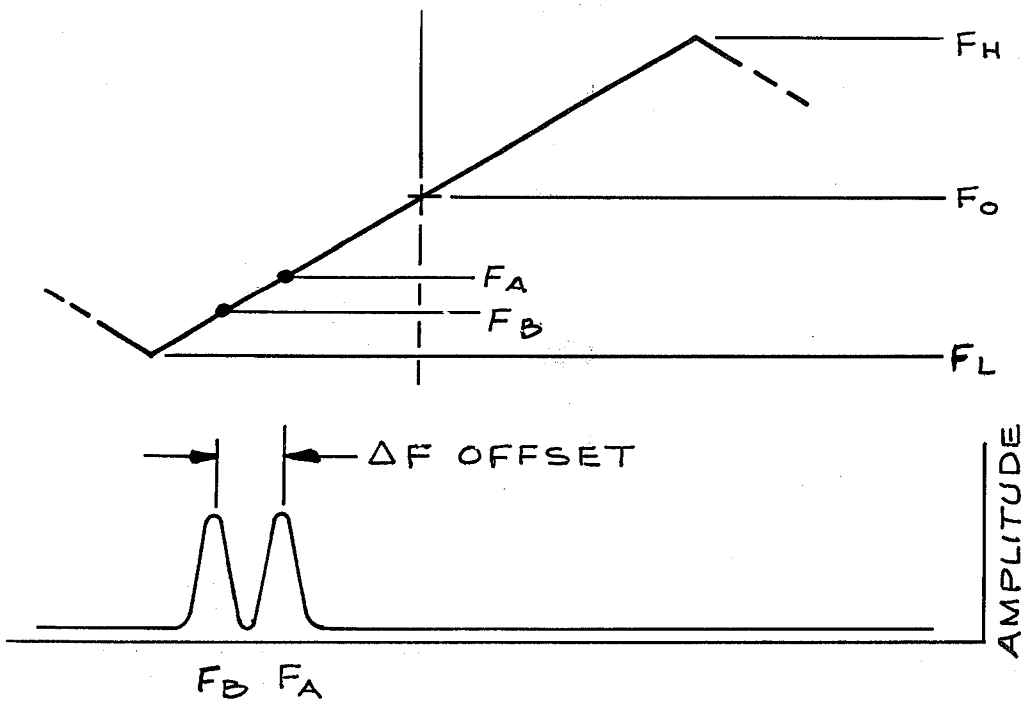
FIG. 7 is a graphical presentation of waveforms illustrating the effect of two signals within the bandwidth of a discriminator operating in the band-pass mode according to the present invention.

The case where the resonant cavity of the discriminator according to the present invention is a band-pass filter is shown in FIG. 7. Note that the output of the discriminator in this case is an amplitude peak rather than an amplitude dip. In all other respects the principle of operation is the same.

The principle advantage of the band-pass approach is its operation in the presence of multiple signals. The advantages of the band-pass approach are opposite to those of the band-reject, principally as follows.

Unlike the band-reject approach, the band-pass discriminator is only responsive to signals within its bandwidth (assuming infinite off-resonance rejections as the ideal case). Therefore, it can be programmed to lock onto any particular signal, not necessarily the largest signal. If the signal occurs outside of the discriminator bandwidth, there will be no output from the detector. This rejection can be made infinite for a CW signal by capacitively coupling the diode output. Thus, since the signal will not be modulated by the cavity, it will not be coupled through the discriminator even if there is a DC rectified output in the detector.

Another advantage of the band-pass versus band-reject approach is the operation in the presence of multiple signals in the desired bandwidth. Conventional discriminators cannot provide useful outputs if two signals of like amplitude occur simultaneously within the same discriminator bandwidth. As is indicated in FIG. 7, two signals can be processed independently in the discriminator by sorting them out after video detection.

In the band-pass approach there might be some benefit to increasing the number of resonators. This could increase the off-resonance isolation of the YIG filter and also would make the filter skirt response sharper. This might be used if the dynamic range of the input signals was particularly large. It has the disadvantage that the air coil would have to put an identical magnetic field on both resonators or else the cavities would not track exactly and the resolution might suffer.

The electronic control of the air coil sweep 25 and the capability to adjust the bandwidth of the discriminator in bandwidth control 19 of FIG. 2 make possible several preferred embodiments for generating the characteristic output voltage versus input frequency discriminator curve. FIG. 8 illustrates two methods of comparing the detector output to the phase of the sweeping means. Both depend on generating a trigger pulse at the peak (or fixed threshold level) of the detected output signal illustrated in FIGS. 4B through 4F. These methods are preferred for those applications in which the discriminator bandwidth is very wide with respect to the bandwidth of the resonator and/or accurate frequency information is required in a single sweep.

Figure 8A:
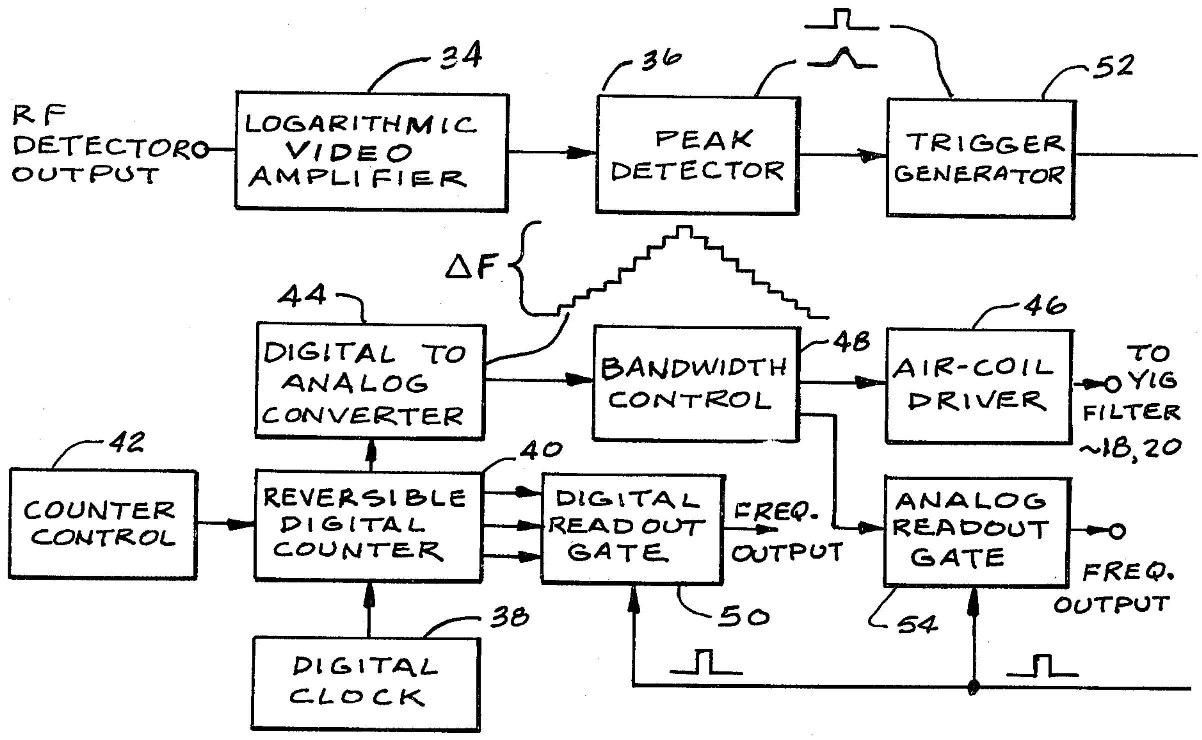
FIGS. 8A and 8B are block diagrams of phase comparison methods useful in this invention when the RF detector output is used to generate a trigger at its peak response.

In FIG. 8A the output of the detector is coupled through a logarithmic video amplifier 34 whose output is proportional to the input power. When a band-reject resonator, as illustrated in FIG. 1, is used to generate the detector output, the rejected power is independent of the absolute input power and the resulting voltage waveform from the log video amplifier 34 is normalized. This simplifies the design of peak detection 36 which generates a standard output trigger at the peak (or fixed threshold level) of the detected waveform. At the same time, a sawtooth or triangular waveform, similar to that shown in FIG. 3, is used to drive the resonator cyclically between $F_L$ and $F_H$ in a linear fashion. The position of the trigger with respect to the input voltage to the sweeping means can then be calibrated to read out the frequency directly relative to the center frequency of the discriminator.

In FIG. 8A the calibrated sweeping means consists of clock 38 driving a reversible digital counter 40 which counts sequentially in either increasing or decreasing counts as controlled by counter control 42. The counter then programs a standard digital to analog converter 44 to generate an output voltage linearly proportional to the number of clock pulses counted. The output of the D/A 44 is then fed to the air coil driver 46 sweeping the resonator linearly across the predetermined bandwidth. Bandwidth control 48 is a scaling control which adjusts the current drive into the air coil to correspond to the desired discriminator bandwidth. The input frequency to the discriminator is then determined by gating out the digital count in counter 40 by readout gate 50 at the time of the intercept trigger generated in trigger generator 52. This provides an immediate digital indication of frequency relative to discriminator center frequency. Alternatively, the calibrated analog output of the bandwidth control 48 could be gated through readout gate 54 to generate an analog measure of relative frequency. Obviously, analog outputs could also be provided with simpler voltage generated sweeping means than illustrated, the prime requirement, however, is that a linear relationship exists between the sweeping means and the position of the resonator in order to obtain a linear discriminator curve.

The digital or analog measures of input frequency relative to the discriminator center frequency represent a sampled demodulation of the input signal at rates equal to sweep rate of the particular sweeping means. Standard procedures for processing sampled input signals can be used to recover the input modulation.

Figure 8B:
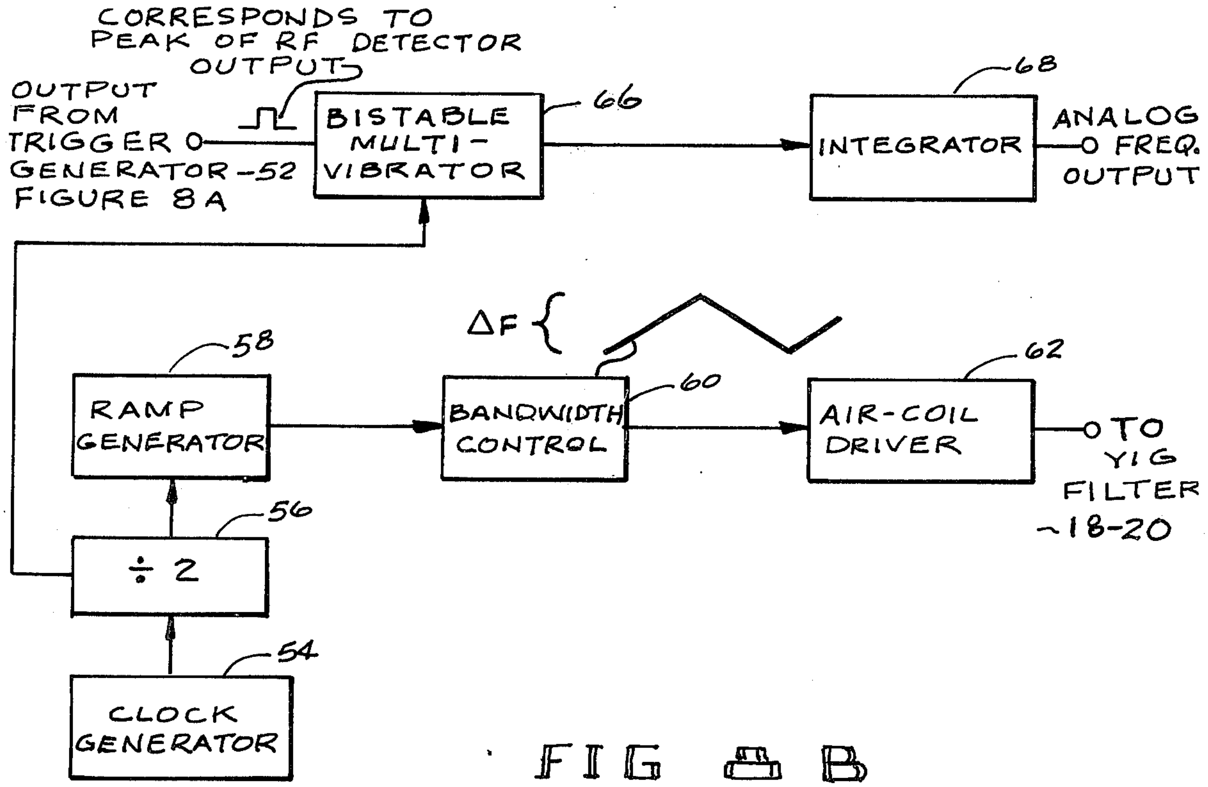

FIG. 8B illustrates an alternate embodiment for comparing the phase of the detector output to the sweeping means to generate the standard discriminator curve. Again the trigger generating means of FIG. 8A is used to detect the peak output of the resonator. The sweeping means is generated by dividing by 2 the frequency of clock generator 55 in divider 56. The output pulse from divider 56 is integrated in ramp generator 58 to generate a linear triangular waveform similar to that shown in FIG. 3. The voltage output of this waveform is scaled in bandwidth control 60 to set the desired discriminator bandwidth. The output of control 60 is used to drive air coil driver 62 to generate a linear resonator sweep.

The trigger pulse from trigger generator 52 in FIG. 8A is used to control a bistable multivibrator 66 that is referenced to divider 56. This phase comparison method is similar to that described in the prior art by C. E. Arnold et al (U.S. Pat. No. 2,764,682). The output of multivibrator 66 is integrated in integrator 68 to provide an analog voltage proportional to the position of the trigger pulse (the detected output) relative to the driving waveform of the resonator. The output therefore measures the relative phase between the detected input signal and the sweeping means. If the sweeping means is linear over the predetermined bandwidth, the analog output will be a linear function of frequency across the entire bandwidth of the discriminator.

Figure 9A:
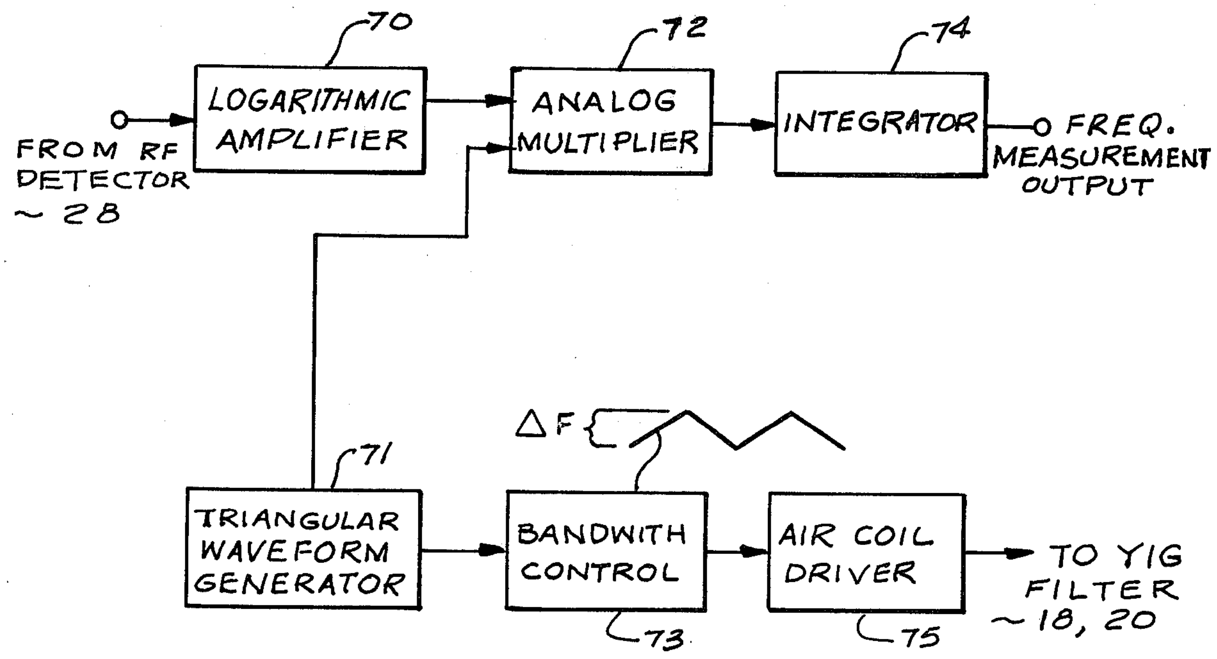
FIGS. 9A and 9B are block diagrams of phase comparison methods useful in this invention when the analog output of the RF detector is processed.

In those applications where the bandwidth of the discriminator is required to be relatively narrow with respect to the bandwidth of the resonator, or where spurious magnetostatic modes on the resonator could cause false triggers in the digital processing techniques, analog processing to determine relative position of the output with respect to the sweeping waveform is possible. Two such approaches are shown in FIG. 9. FIG. 9A is similar to the prior art approaches associated with mechanical scanning of the resonators except that the sweeping is a linear triangular waveform and an attempt is made to normalize the output of the detector versus input signal amplitude by using a logarthmic amplifier 70 at its output. The analog phase detector comprises an analog multiplier 72, which multiplies the output from the log video amplifier 70 by the output of triangular waveform generator 71 (which also drives the bandwidth control 73 and air coil driver 75), and an integrator 74. The relative position or phase of the detected output and the sweeping waveform is measured by the voltage output of integrator 74. The limitations of this approach are the slope dependence of the overall discriminator curve on the shape and output voltage level of the logarithmic amplifier.

Prior art approaches to processing the analog output of a cyclically sweeping resonator have depended on a phase detector that used the resonator driving waveform as a reference to account for the effective phase reversal of the RF detector output on alternate positive and negative tuning excursions (see FIG. 4C or 4E). Such phase reversals preclude the possibility of using a narrow band filter at the output of the RF detector to isolate the fundamental component of the cyclical waveform. The reason for this is because in this case the filter is alternately excited by opposite phase video inputs, and the phase and amplitude of the filter output are a complex function of the relative position of the RF detector output and the sweep waveform. In the current invention, one unique embodiment of the means for comparing the phase of the resonator sweeping means to the output of the RF detector consists of using a sawtooth waveform shown in FIG. 9B to drive the resonator. In this case the analog outputs from the detector are all in proper phase so that a narrow band filter can be used to extract the fundamental frequency from the waveform. It can readily be shown that the phase of the fundamental component of the waveform is a linear function of the position of the detector output relative to the sweeping waveform.

The importance of processing the detector output through a narrow bandwidth filter is severalfold:

1. The filter prior to phase detection limits the noise bandwidth of the phase comparison means and extends its capability to accurately measure the phase of low level signals relative to the sweeping means.

2. The filter reduces the sensitivity of the processor to sharp variations or discontinuities in the shape of the detected output, e.g., spurious resonances caused by magnetostrictive modes.

3. The filter eliminates harmonics and allows the amplitude of the signal to be limited thereby eliminating dependence of the phase detector output on the amplitude of the RF detector 28 or log video output 29 in FIG. 2.

Figure 9B:
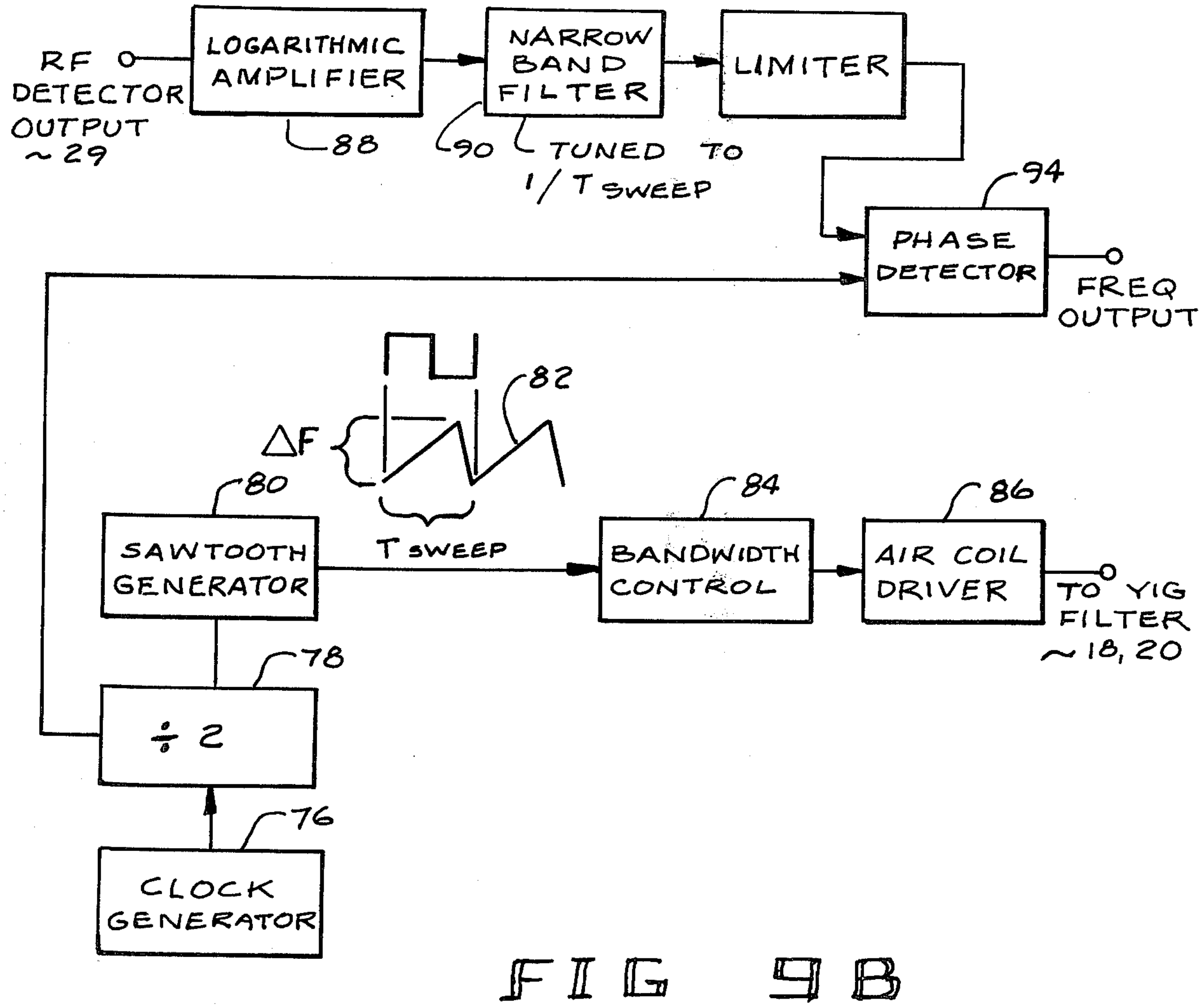

FIG. 9B is a block diagram illustrating operation of this unique phase comparison embodiment. Clock generator 76 is divided by 2 in digital divider 78. The divider output triggers sawtooth generator 80 putting out the voltage waveform 82 shown. The sawtooth retrace is about 10 percent of the total period. The sawtooth voltage is scaled in bandwidth control 84 and then applied to air coil driver 86 to sweep the resonator in one direction only. The RF detector 28 output is amplified in logarithmic amplifier 88 and the fundamental component of the detected output is filtered in narrow bandwidth filter 90 tuned to the reciprocal of the sweep time. The output of this filter is applied to limiter 92 to eliminate amplitude variations in the input, and the limited signal is applied to phase detector 94 and compared with the reference phase from divider 78. Phase detector 94 provides an output voltage that is linearly proportional to the relative position of the detector output with the sweeping sawtooth waveform, thereby generating the desired discriminator curve.

These and other variations of the means for comparing the detector output to the phase of the sweeping means will become obvious to persons of ordinary skill in the art to generate the necessary discriminator characteristics.

The present novel wide bandwidth discriminator has application in all areas where conventional discriminator techniques are used as well as several areas of application that can exploit its unique characteristics. In addition to its obvious discriminator advantages, the center frequency of the discriminator can be tuned in a single magnetic housing from the low frequency limit of YIG devices (about 200 MHz) to the magnetic saturation capability of the magnet (above 40 GHz). This tuning of center frequency can be continuous and the actual resonator can be as small as or smaller than .010 inches in diameter. It is, therefore, possible to put several discriminators under the same magnet housing. This could serve to optimize performance versus frequency, e.g., a gallium doped YIG sphere could cover the 200 to 4GHz range; a 20 mil YIG sphere could cover the 4GHz to 18 GHz range and a 10 mil sphere of pure YIG sphere could optimize coupling to 40 GHz. Further, placing several discriminators in the same magnetic housing could serve to provide tracking discriminators inside the same magnetic package, e.g., DC current offsets in two coils could keep the two discriminators 60 MHz apart so that signal sources could be controlled at a given frequency offset over a broad center frequency range. Also a discriminator could easily be put under the same magnetic pole piece as other conventional YIG devices. Thus, it would provide a center frequency offset control for conventional YIG harmonic generation, multi-resonator filters or, oscillators, etc.

Some significant embodiments of the present discriminator include:

1. Frequency Control of signal sources;
2. Measurement of deviation and Linearity of Microwave Sources;
3. Frequency measurement of signal sources;
4. Demodulation of FM signals; and
5. Tracking control for other YIG devices.

Each of these will be described along with exemplary preferred embodiments of the invention.

FREQUENCY CONTROL OF SIGNAL SOURCES

Solid state sources are available commercially to cover the frequency range from 10 MHz through 18,000 MHz. In the range below 500 MHz, these sources are typically generated by heterodyning a variable 1 to 2 GHz oscillator with a fixed frequency oscillator at about 2 GHz. The resulting output usually covers about a 100 to 1 range. Above 500 MHz this approach generates an intolerable spurious output level so that fundamental oscillators are generally preferred. The fundamental oscillators are electronically tuned over several octave ranges by either varactor or YIG devices. The current approach is to build each octave band as a stand alone module; therefore, if oscillator coverage from 500 MHz to 18,000 MHz is desired, at least 6 channels are required. Each channel has duplicate precision components to provide frequency accuracy and stability; each channel has some type of load isolation to prevent frequency pulling by load mismatches and each channel has temperature compensation built into both the oscillator and the driver. In multiband use, all channels must be kept on to minimize turn-on drift; each channel is optimized to reduce second and higher order harmonic components. The net result is that a multichannel oscillator from 10 MHz to 18 GHz is extremely expensive.

The application of the wide bandwidth tunable discriminator in source control is to provide a single device which fixes:

1. frequency accuracy
2. frequency stability
3. frequency linearity
4. frequncy resetability
5. isolation from load variations (frequency pulling)
6. isolation from power supply variation (frequency pushing)

and which:

7. eliminates thermal turn-on drift
8. provides continuous tuning at band cross-over frequencies.

Further, with a single control device, it now becomes practical to provide true digital control by means of calibrated D/A converter. This extra cost can now be spread across each of the bands.

The overall benefit of single control device is more precise control of each oscillator while at the same time substantially reducing its cost. since the individual oscillator performance is now substantially less precise, and therefore less costly, it is possible to increase the number of oscillators to maximize the output power and/or reduce the harmonics by using low pass filter at each output.

Some of the features of the wide bandwidth tunable discriminator are such that it can also be effectively used to control YIG oscillators. For example, it lowers the cost of their manufacture by allowing several oscillators to be built in the same housing; it can eliminate the need for rotating the sphere to the zero temperature axis (instead it can be rotated for maximum Q), it eliminates post-turning drift due to RF heating of the sphere; it can provide continuous tuning of oscillators at their cross-over frequency, etc.

The specific features of the wide bandwidth discriminator that are advantageous in the control of RF signal sources are:

1. Wide Center Frequency Tuning Ranges

It is possible with this discriminator to continuously control oscillators from 500 MHz through 40 GHz with a single device.

2. Variable Discriminator Bandwidth

The wide bandwidth of ± hundreds of MHz is a capability that is unique to this tunable discriminator. The benefit is that this provides a wide capture range to pull in coarsely tuned oscillators.

The ability to reduce the bandwidth to a few MHz means that the resolution of the discriminator and its slope can be optimized for best resolution and noise performance.

3. Fast Sampling Speeds

Because the discriminator can be scanned at up to MHz rates, the capture and control of the oscillator can be provided in microseconds.

4. Linearity

In the initial capture, the linearity allows for a quick coarse correction of the oscillator to put it within a few MHz of the center frequency. The narrow bandwidth of the discriminator can then be used. Also, the loop gain is constant across the discriminator bandwidth.

5. Insensitivity to Input Amplitude Variations

This eliminates any need to level the oscillator output power before measuring frequency.

6. Selection of Maximum Input Signal

This feature insures that the oscillator fundamental is locked and eliminates any possible confusion over locking on harmonics of spurious signals.

Figure 10:
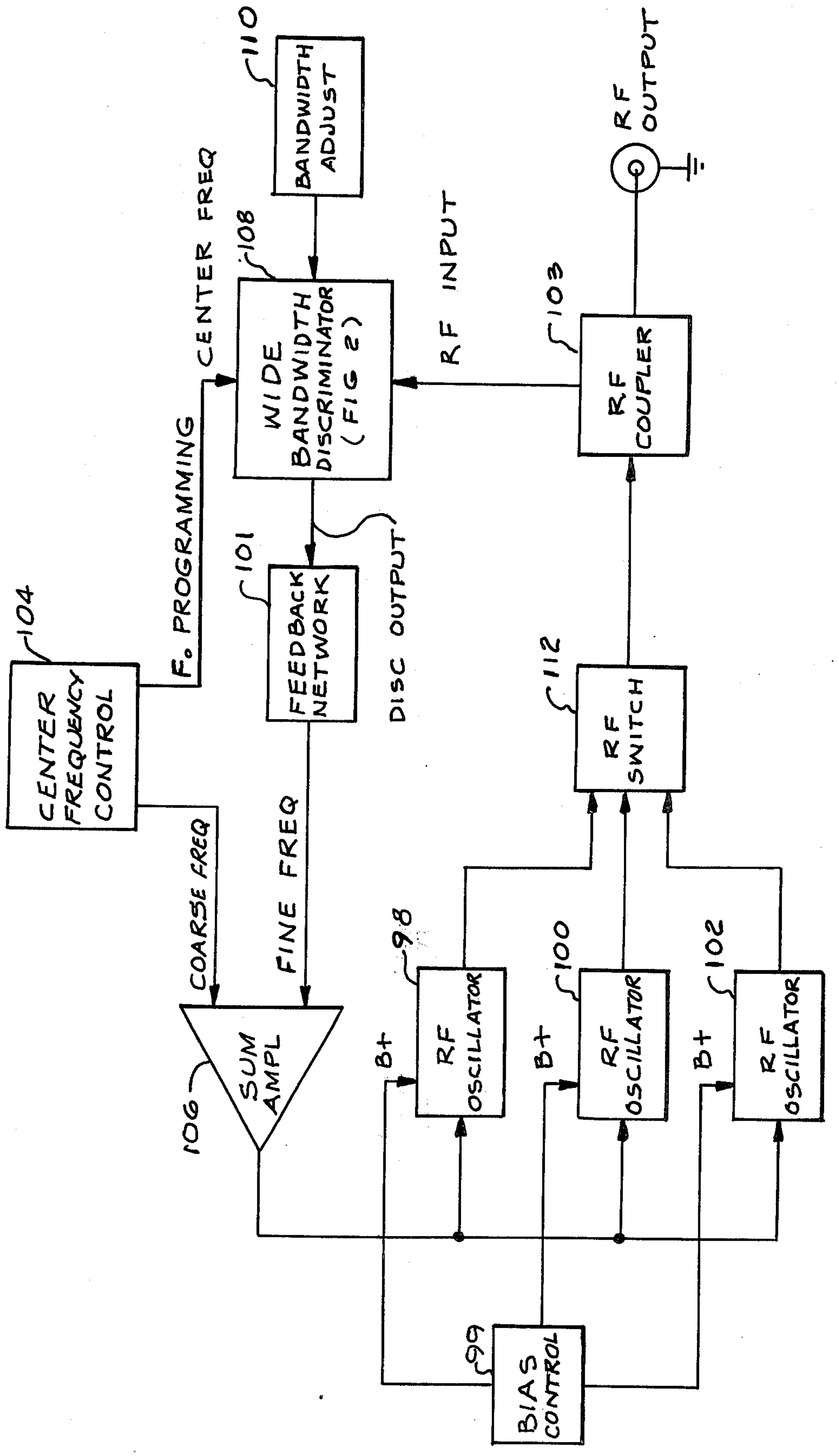
FIG. 10 is a block diagram of a frequency control embodiment of the frequency discriminator according to the present invention.
Figure 11:
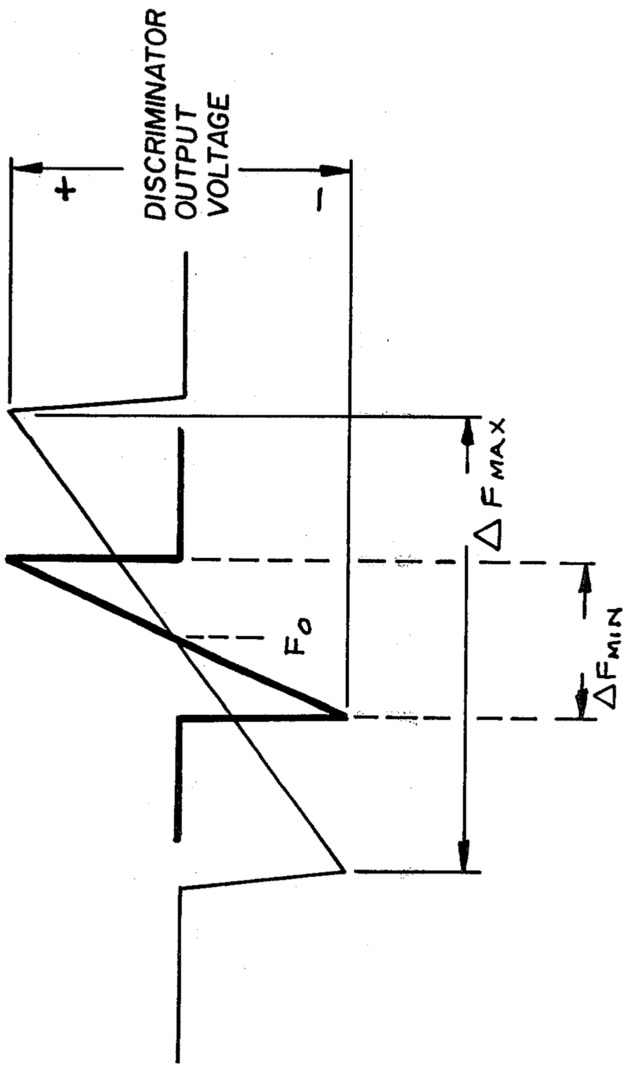
FIG. 11 is a graphical presentation of waveforms useful in understanding the embodiment of FIG. 10.

Referring now to FIGS. 10 and 11, a frequency control embodiment including the wide bandwidth frequency discriminator of FIG. 2 is shown. Assume that the desired operation consists of contiguous scan of RF oscillators 98, 100 and 102, and the RF coupler 103 samples the oscillator output to provide input for discriminator 108.

Initially, the center frequency control 104 is tuned to the lowest frequency of oscillator 98 and a coarse frequency tune is applied to oscillator 98 via summing amplifier 106. The wide bandwidth discriminator 108 is centered at the correct $F_0$ by tuning unit 104 (see FIG. 11).

Next the wide bandwidth position ($\Delta F$ max. of FIG. 11) is switched into operation by bandwidth control 110 and the bias voltage B+ is applied to oscillator 98 by bias control 99. In the $\Delta F$ max. position, the oscillator is quickly tuned near $F_0$ by the closed loop feedback control network 101. If necessary, the gain of the loop can then be increased by switching in the $\Delta F$ min. bandwidth on the discriminator). Now as $F_0$ is tuned by center frequency control 104, the oscillator will be forced to track $F_0$ by the feedback control action of the discriminator 108.

When the $F_0$ control reaches the highest frequency in oscillator 98, then oscillator 98 is turned off and oscillator 100 is turned on. The discriminator bandwidth is again swtiched to ΔF max. to capture oscillator 100, which is also forced to track the $F_0$ of the discriminator. Note that the $F_0$ tuning is continuous and there is only a transient as one oscillator is turned off while the other is turned on. The discriminator frequency reference can be stopped momentarily at this time to allow any transients to die down before continuing the scan.

It is not necessary to turn the oscillator off and on if there is sufficient isolation in the RF switch 112 to meet the spurious signal requirements. However, high isolation fast RF switches are expensive and this offers an economical approach with significantly improved isolation over the techniques that are commercially available.

Control of oscillator 102 is passed on from oscillator 100 in much the same way as from oscillator 98 to 100. At the end of the tuning range of oscillator 102 the sequence can be repeated. The sweep rate is limited by the scanning capability of the discriminator 108.

Although the principle of operation has been described for the control of solid state sources, the approach can be equally effective in controlling any source which has an electronic tuning capability, such as a backward wave oscillator, klystron, carcinotron, etc.

The discriminator frequency reference 108 can be controlled by a digital to analog converter so that digital programming can be easily transferred to all of the sources. Such programming in a digital fashion can be augmented by a phase lock control of the oscillators.

FREQUENCY MEASUREMENT OF SIGNAL SOURCES

Figure 12:
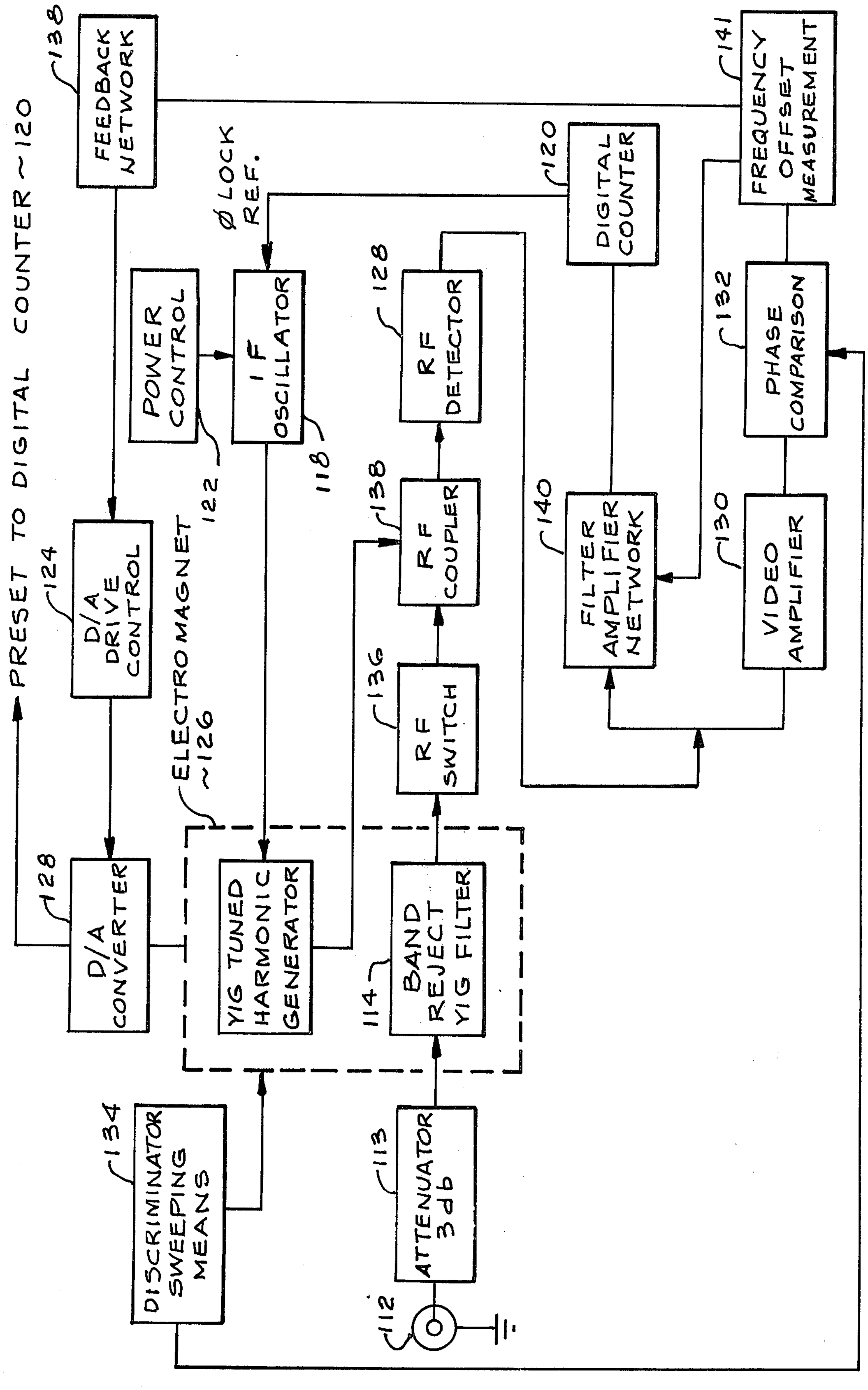
FIG. 12 is a block diagram of a heterodyne frequency counter embodiment of the frequency discriminator according to the present invention.

Another useful capability of the discriminator is to augment the operation of an automatic heterodyne counter by determining the exact frequency offset of the unknown input frequency relative to a harmonic comb line. In this manner, the IF bandwidth of the amplifier following the RF conversion process can be reduced. This significantly offsets two of the principal limitations of prior art heterodyne counters: the susceptibility to interference in the presence of multiple signals and the difficulty in measuring low level signals due to the wide noise bandwidths of the IF amplifiers currently in use. It also allows for the use of harmonic comb line spacing much wider than is currently possible, e.g. 500 MHz versus 100 to 200 MHz. A wider comb line spacing increases the RF comb power available form the harmonic generator at frequencies above 12 GHz and provides better isolation between adjacent comb lines. This further improves sensitivity and extends frequency measurement to much higher frequencies (e.g. to 40 GHz). At the same time, the presence of an input signal and the selection of the proper harmonic for converting it to IF can be provided by the current invention directly from the RF input signal rather than after IF processing as is currently required. A block diagram of an embodiment of the invention for improving automatic heterodyne counting is shown in FIG. 12.

The RF input signal at terminal 112 is applied through 3db attenuator 113 to a band-reject type YIG filter 114 which is included in the same magnetic housing as YIG tuned harmonic generator 116. Harmonic generator 116 is driven from a fixed IF oscillator 118 which is phase locked to the basic counter 120 as is common in the prior art. Power control 122 provides a means to turn off or reduce the input drive to the harmonic generator. Digital-to-analog 128 drive control 124 provides the tuning control for electromagnet 126.

Initially, the IF oscillator 118 input drive to the harmonic generator 115 is turned off and D/A 128 continually step tunes YIG filter 114 over the desired operating range (e.g. 018 to 26 GHz) in steps coarsely equal to the comb line spacing (equal to the frequency of oscillator 118). In this mode (Mode A), YID filter 114 operates in conjunction with RF detector 128, video amplifier 130, phase comparison means 132 and sweeping means 134 to form the discriminator of FIG. 2. Sweeping means 134 cyclically scans YIG filter 114 over a range equal to or greater than the comb line spacing. When the discriminator intercepts an input signal, an output similar to FIG. 3 is generated. The novel ability of this discriminator to select the largest signal will eliminate false-locking problems.

When a signal is detected in the discriminator, D/A drive 124 stops the scanning of electromagnet 126. A frequency measurement with the discriminator of the offset of the signal with respect to the nominal comb line frequency is used to select the best comb line for heterodyne conversion. The comb line number is preset in digital counter 120.

At this point, power control 122 turns on the IF drive to YIG tuned harmonic generator 116. Note, however, that electromagnet 126 has not necessarily tuned the YIG harmonic generator exactly on to the desired comb line.

This is accomplished with this invention by using a combination of the YIG tuned harmonic generator 116 (now in a band-pass embodiment), RF detector 128, video amplifier 130, phase comparison means 132 and sweeping means 134 to form the discriminator of FIG. 2. In this mode (Mode B), RF switch 136 is opened to isolate the input signal from RF detector 128 and RF coupler 138 applies the RF output from the harmonic generator 116 to RF detector 128. The output from phase comparison means 132 is coupled back to D/A drive 124 through feedback network 138. This fine control on the electromagnet current centers the quiescent tuning of the housing at the exact comb line frequency.

Therefore, the harmonic comb line that will heterodyne the input signal frequency into digital counter 120 has been selected and its output power optimized. At this time, operation reverts back to Mode A where the input signal offset is now measured by the discriminator with respect to the updated tuning of the housing (now centered on the comb line frequency). Filter/amplifier network 140 is then tuned to the offset frequency measured in network 141 by the discriminator. The bandwidth of filter 140 can be considerably less than the IF combe spacing thereby significantly improving the capablility of the automatic heterodyne counter to measure low level input signals and to operate in the presence of multiple inputs. The input drive 118 to harmonic generator 116 is then turned on, and RF detector 128 heterodynes the input signal and the selected comb line in the conventional prior art manner. Periodically, preferably during the reset period of digital counter 120, the discriminator reverts into Mode A assuring that filter 140 is tuned to the proper IF offset and that the YIG tuned harmonic generator is tuned to the optimum comb line.

DEMODULATION OF FM SIGNALS

This novel bandwidth discriminator technique provides a discriminator that makes practical low cost FM communications systems at microwave frequencies. Most microwave communication (low cost systems) use AM modulation techniques because low cost FM discriminators were not previously available. This novel discriminator brings into the microwave region all of the advantages that FM communication has over AM in the lower frequency broadcast bands. In fact, at microwave frequencies in the presence of multipath reflections and large amplitude variations in received signal level, the basic advantages of FM are even more significant.

The advantages of the discriminator according to this invention are particularly singificant in this embodiment:

Linearity — critical to accurately reproduce input signal.

Insensitivity to signal variations — eliminates need for RF limiter — allows operation in environment causing rapid or severe changes in input amplitude.

Sensitivity to low level signals — amplification can be provided after detection thereby eliminating cost of RF preamplification.

Rejection of interferring signals — can pick out largest signal in environment.

Simple center frequency tuning — using air coil tuning, discriminator can readily track the center frequency.

Variable ΔF range — can capture signals over a wide range and then adapt ΔF sweep to match source and maximize detection slope.

Simplicity — entire discriminator can consist of antenna, permanent magnet, a single YIG sphere, turning coil, diode detector, video amplifier, phase detector, filter and AM amplifier and speaker.

Figure 13:
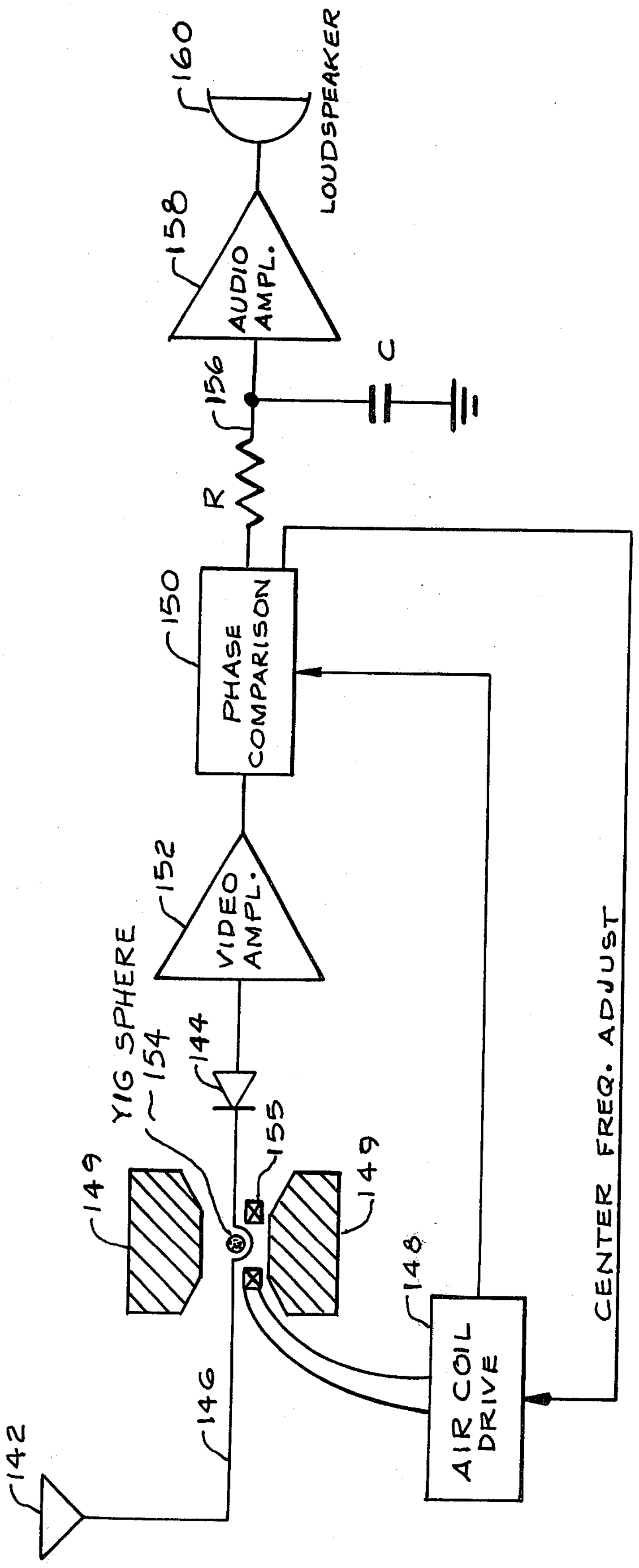
FIG. 13 is a partially schematic, block diagram of a frequency modulation reciever embodiment of the frequency discriminator according to the present invention.

Referring to FIG. 13 wherein an exemplary embodiment of an FM receiver according to the invention is shown, the FM modulated input signal is incident upon a microwave antenna system 142. The signal is routed directly to RF detector 144 through transmission line 146. The air coil drive 148 is set for maximum ΔF to ensure capturing the signal. The offset frequency of $F_O$ relative to the permanent magnet 149 bias field is measured in phase detector 150 and a DC current to air coil drive 148 centers the discriminator (provides automatic frequency control). Next, the ΔF range is optimized to match the input signal deviation. Video amplifier 152 amplifies signal generated as YIG 154 sweeps through RF input signal (either band-pass or band-reject can be used) by means of air core coil 155. Phase detector 150 basically compares the RF detector 144 output position to the sweep waveform creating a conventional FM discriminator curve using methods such as depicted in FIGS. 8 and 9. This output is filtered in the RC circuit 156 to remove the sample rate from discriminator and to pass the modulation rate. For example, for voice communication, the sample rate should be twice the maximum modulation rate to recreate the original information. Audio amplifier 158 drives speaker 160.

Since the sample rate can be in MHz range, it is also possible to use this technique to demodulate pulse code modulated data communications and multiple subscarriers. Sensitivity could be improved by means of a solid state RF amplifir inserted after antenna 142. The YIG and such an amplifier could be combined. With preamplification, a band-pass YIG configuration would improve the sensitivity by reducing the noise bandwidth of the receiver and simultaneously reducing off-channel interference.

An alternate embodiment is to couple into YIG resonator 154 with techniques that are conventionally known to use mon-reciprocal properties of YIG. This would allow signals to propagate in one direction and isolate in the other direction. The non-reciprocal capability of YIG material is useful for making negative resistance amplifiers, such as tunnel or Gunn diode devices, to provide a low cost RF preamplifier.

MEASUREMENT OF TRANSMITTER DEVIATION AT MICROWAVE FREQUENCY

Important microwave measurements in the communications and signal simulations field are those of center frequency, modulation deviation and deviation linearity of a transmitter when excited by baseband information. At frequencies below about 1 GHz the input frequency is heterodyned into a conventional two cavity IF discriminator to measure deviation. However, as the maximum deviation increases it becomes more difficult to achieve this performance at an IF frequency. Therefore, measurements of deviation in microwaves are generally provided by the carrier-null technique which depends on the well known principle that at certain modulation indicies $(\Delta F)/(F_R)$ the carrier energy goes to zero and all of the energy appears in the sidebands. By measuring $F_R$ (rate of modulation), knowing the appropriate value of the modulation index, the deviation (ΔF) can be accurately calculated. A major problem, however, is that a spectrum analyzer is needed to measure the carrier nulls thereby making the measurement awkward and expensive in the field. Another prior art method is to use a calibrated dispersion spectrum analyzer directly. Both approaches require an operator for interpretation and cannot provide useful outputs for automatic control.

The novel discriminator according to this invention permits a much simpler approach to measure deviation and since the discriminator can track a slow sweeping carier, it becomes practical to measure the linearity of the modulator directly at RF using well known techniques in the present art but previously limited to IF. In this case, a simple AFC can lock the discriminator to the carrier component of the input signal to be measured. The sample rate of the discriminator scan must be high enough so that it is several times the modulation rate of the transmitter.

Figure 14:
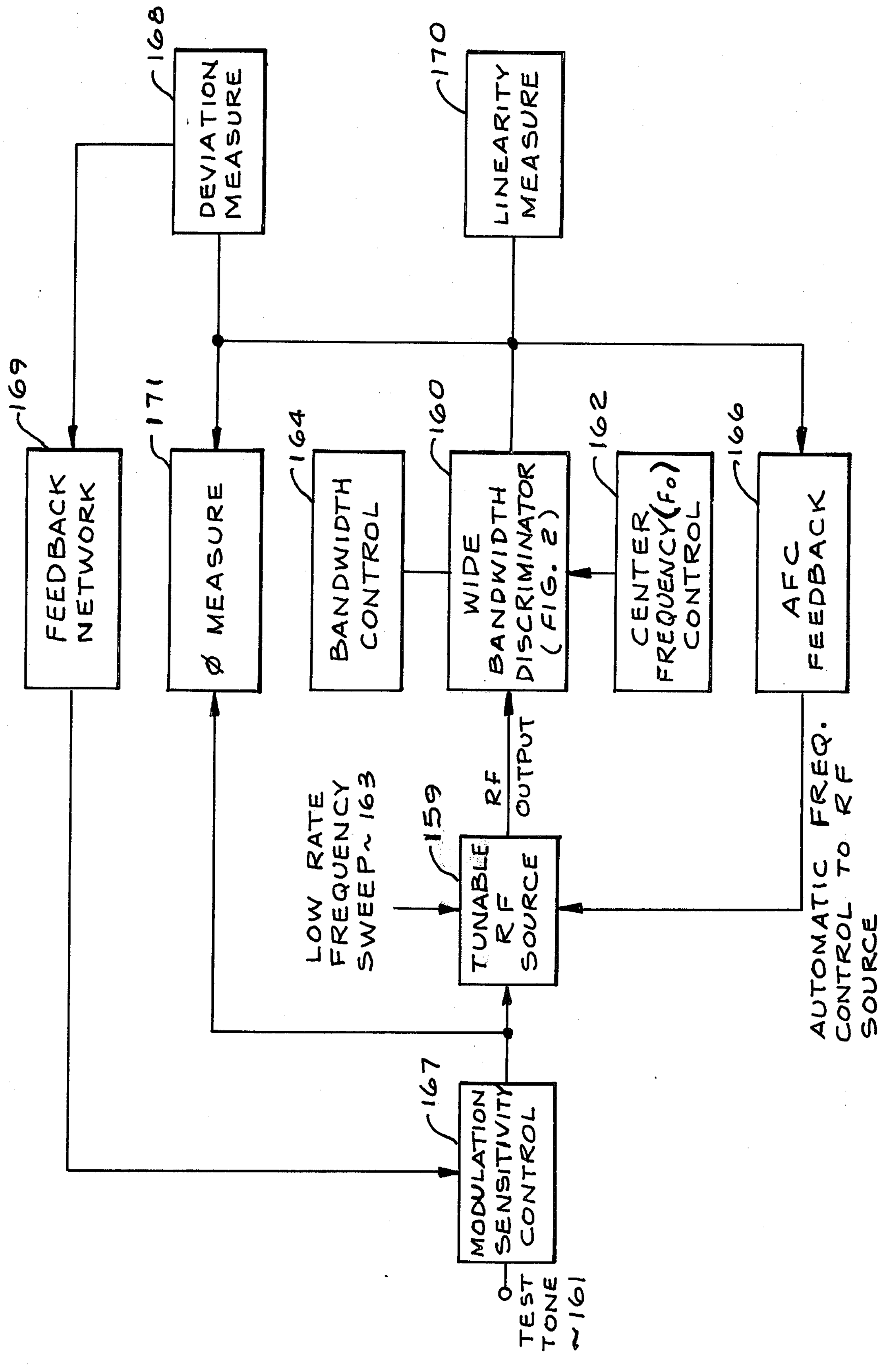
FIG. 14 is a block diagram of a microwave frequency measurement system embodiment of the frequency discriminator according to the present invention.

A block diagram of an exemplary embodiment is shown in FIG. 14. The output from RF source 159 is coupled directly into discriminator 160 of this invention (shown in FIG. 2). Discriminator 160 has center frequency turning control 162 for controlling the quiescent frequency $F_O$ of the discriminator and a bandwidth control 164 for adjusting the seeep width of the resonator. The discriminator 160 output is applied through an automatic frequency control feedback network 166 to keep the discriminator centered on the input carrier or alternately keep the source 159 frequency centered on the discriminator. The output of the discriminator is applied to a deviation measuring means 168 and to the linearity measuring means 170.

The automatic frequency control capability of the discriminator 160 locks onto or controls the tunable RF source 159. The discriminator 160 bandwidth is then optimized to detect the deviation of a test tone 161 applied to the RF source 159. The sample rate of discriminator 160 should be at least several times as fast as the test tone. Since the bandwidth of the discriminator can be accurately known, the test tone deviation can be measured directly. The actual measurement can be made using any of the methods shown in FIGS. 8 and 9. A feedback network 169 from deviation measurement means 168 permits adjustment of the modulation sensitivity control 167 to adjust the modulation sensitivity of the source to match the desired deviation.

To measure deviation linearity, a low frequency sweep 163 (typically 70 Hz) can be applied to the RF source along with the test tone. The discriminator can track the low frequency sweep and simultaneously demodulate the test tone. By measuring and comparing the amplitude level of the demodulated tone across the entire deviation bandwidth of the low frequency sweep, the linearity of the modulator can be measured. This is a standard test used in communication receivers except performed only at IF.

It is also possible to measure group delay with this demodulator by comparing the phase of the modulator test tone to the phase of the demodulated output across the deviation bandwidth. A phase measuring means 171 receives a sample of the discriminator 160 output and a sample of the modulator test tone. The procedure used is identical with conventional techniques except that the discriminator provides RF demodulation of the test tone compared with the more conventional IF demodulation.

The use of the discriminator of this invention to simultaneously provide a means to measure and control (through feedback techniques) the center frequency, deviation and deviation linearity of a microwave source makes it particularly useful for RF signal simulators. In this case, a single YIG-tuned wide frequency range discriminator can set up and update the center frequency and modulation bandwidth of a number of varactor-tuned oscillators. The discriminator AFC transfers the excellent center frequency accuracy of YIG devices to the varactor-oscillator tuning, the linear discriminator bandwidth accurately adjusts the bandwidth of the varactor oscillator modulation over a range from a few MHz to several hundred MHz, and the varactor oscillators need only provide the necessary output power and the ability to handle fast modulation rates. This combination of YIG and varactor tuning provides considerably better performance features at a significantly lower manufacturing cost than prior art approaches.

TRACKING CONTROL FOR OTHER DEVICES

Because the wide bandwidth discriminator is so simple, so small and requires so little signal power, it is possible to include it under the same magnetic pole piece as other YIG tuned components to provide an output that tracks the filter to a given input signal.

For example, suppose it is necessary to track a multi-pole YIG filter to a fundamental frequency of a signal source while rejecting harmonics or spurious signals. Currently, such tracking can only be done open loop which makes it quite impractical over wide frequency ranges, particularly when narrow band filters are required, or operation is desired over environmental extremes. Generally, in these cases, it is not possible to monitor the output of the filter to peak the desired response because this would amplitude modulate the output. Also, because the filter is scanning at a fast rate, such tuning could not be accomplished through the main tuning coil quickly enough to establish an effective tracking signal.

Figure 15:
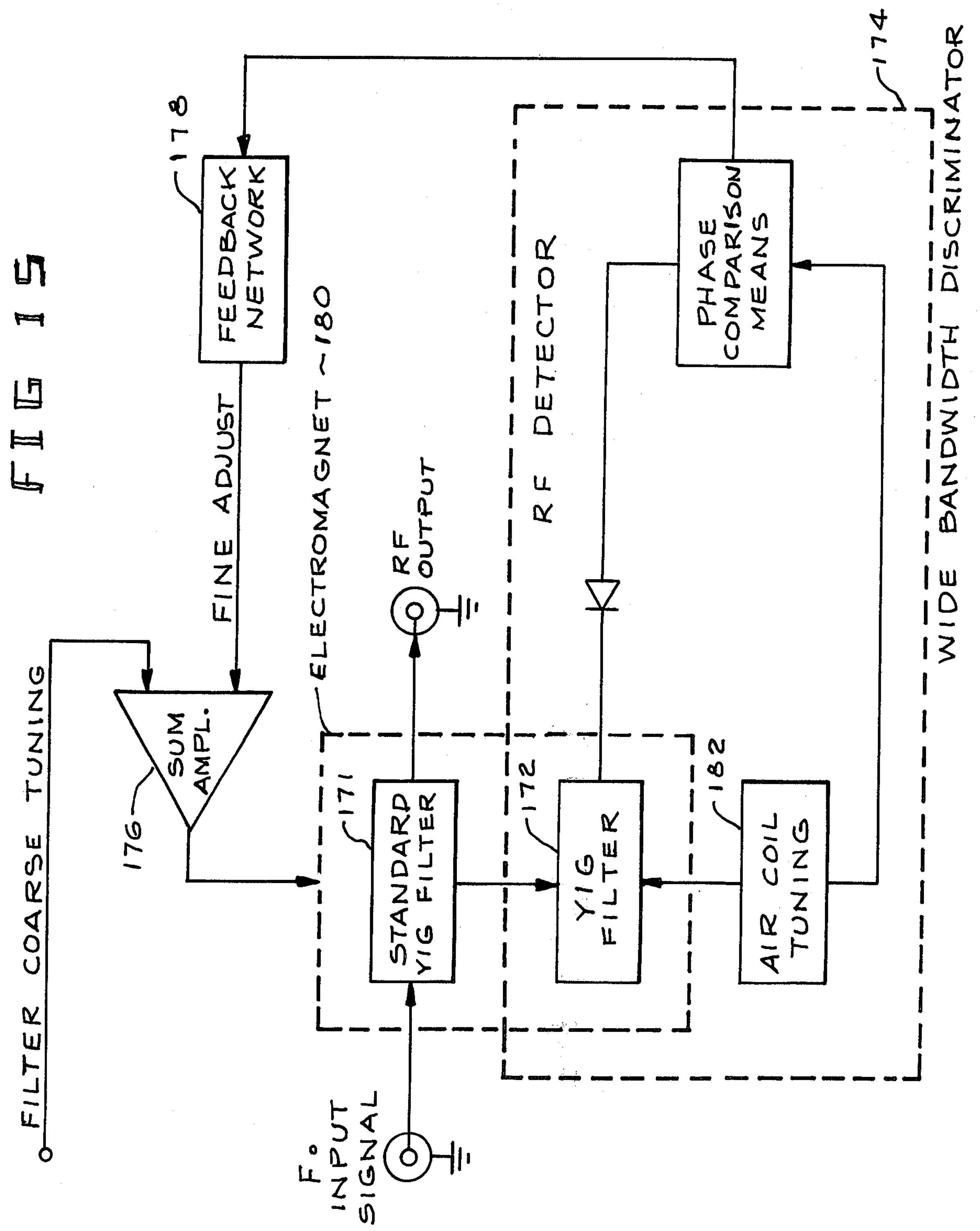
FIG. 15 is a partially schematic block diagram of a frequency tracking device embodiment of the frequency discriminator according to the present invention.

The embodiment shown in FIG. 15 can be used to achieve such results. A small portion (>-30dbm) of the input signal at $F_0$ is coupled from YIG filter 171 and through the band-pass/band-reject YIG filter 172 of the wide bandwidth discriminator 174. (See FIG. 2). Using techniques described previously, an output voltage corresponding to the difference between $F_0$ and the quiescent operating frequency of the YIG housing is fed back into center frequency summing amplifier 176 through feedback network 178. This feedback voltage is phased so that the total tuning voltage corresponds to a quiescent tuning current through electromagnet 180 that will center YIG filter 171 at $F_0$. Since the air coil tuning 182 is sampling at a much higher rate than the sweep rate tuning of $F_0$ the feedback can be very effective in tracking the electromagnet tuning to the input signal $F_0$. The only requirement is that the YIG sphere in the discriminator be under the same coarse tuning field as the filter and that the spheres in the filter and the discriminator be alinged in frequency (basically the anisotropic fields are on the zero temperature drift axis). It is also possible to couple directly off of a filter 171 sphere to provide the resonator for the discriminator.

Since the discriminator YIG can be as small or smaller than 0.010 inches, such tracking is readily achieved. It is also possible that the filter can be centered at a frequency offset from $F_0$ by independently offsetting the discriminator center frequency. This can be accomplished in several ways including: a DC bias on the air coil, varying the reference phase of the feedback loop, varying the sphere position or offsetting the resonance by using the anisotropic field of the YIG. A particularly novel way would be to couple to one of the well known magnetostatic tracking resonances of ferrimagnetic materials to form the resonator of this invention. These spurious modes occur at a fixed offset from the main mode, are independent of frequency, and the offset can be controlled over a considerable range by varying the saturation magnetization of the material. Such offsets are particularly useful in eliminating unwanted mixing products and feedthrough in high level heterodyne mixers and tracking local oscillators and preselectors.

In the tracking embodiment of the wide bandwidth discriminator, an alternative method in certain applications could consist of cyclical sweeping of the input signal rather than the resonant structure. The detected output and phase relationships with the sweeping means are identical to those generated by sweeping the resonant structure. A feedback signal generated in the phase comparator could be applied to either the signal source or the resonant device causing the two elements to track one another.

Figure 16:
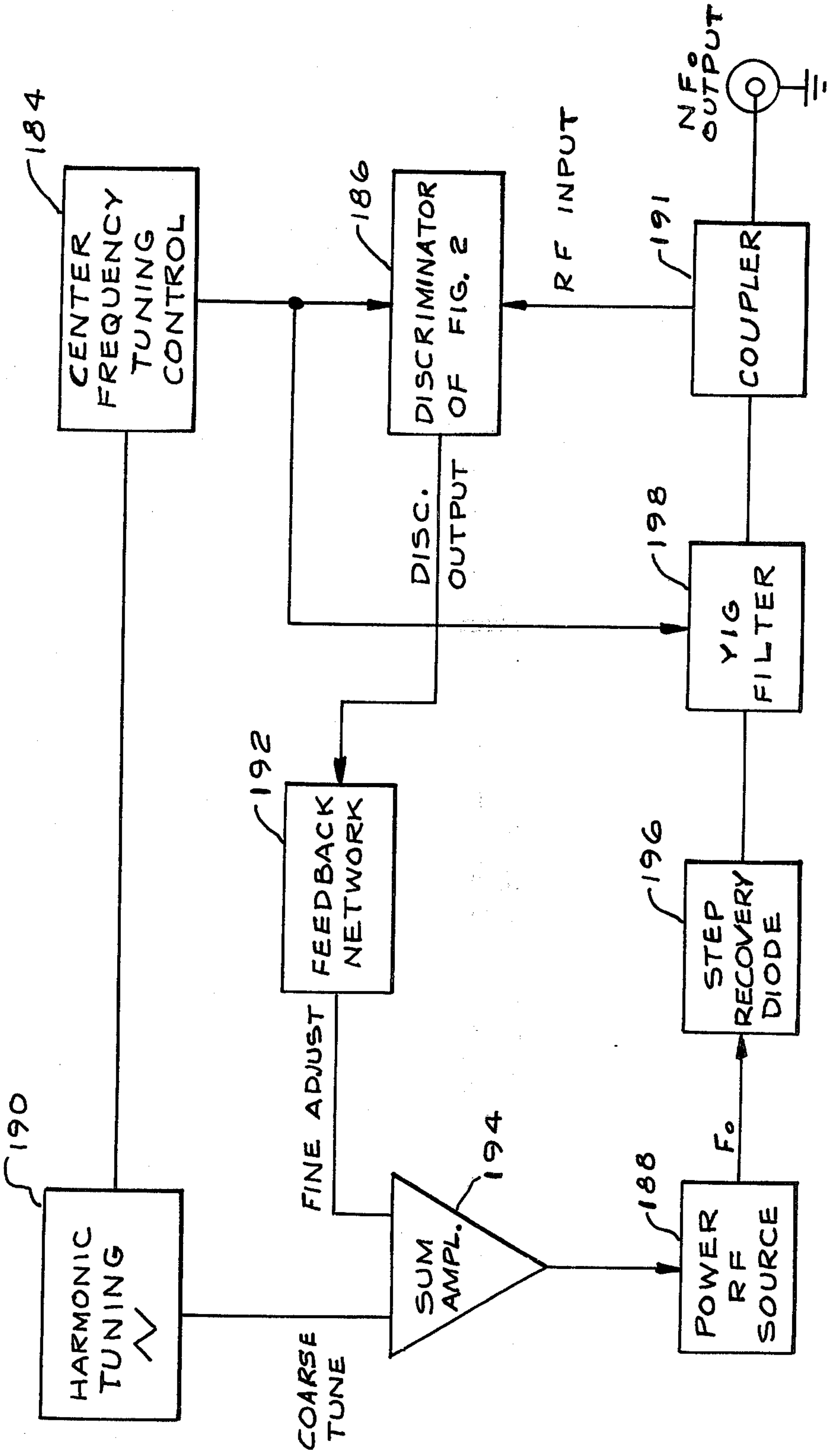
FIG. 16 is a block diagram of broadband oscillator using the frequency discriminator according to the present invention to control the low frequency oscillator driver of a broadband harmonic generator.

Another tracking embodiment is the case of a broadband harmonic generator where the output from the harmonic generator is used to control the frequency of the input source. Prior art harmonic generators use open-loop tracking between input source and output filter, are difficult to align and track, and have discontinuous output tuning of frequency. By using the wide center frequency tuning range of this invention, the desired output frequency can be tuned continuously while successively filtering out the harmonics of the driving source. In this manner, an inexpensive 1 to 12.4 GHz or 2 to 18 GHz signal source can be built with excellent linearity and frequency accuracy using only a single fundamental oscillator. This invention is the key element in providing closed-loop control of frequency as shown in FIG. 16.

A center frequency tuning control unit 184 provides the means for tuning the discriminator 186 over the entire output range. At the same time, a high power input source 188 is coarsely tuned in harmonic tuning network 190 to a frequency equal to the output frequency divided by the harmonic number. A sample of the output is obtained in coupler 191 and an error correction signal generated in discriminator 186 is fed back through network 192 and summed with the coarse control in amplifier 194 to provide fine frequency control of the input source. Thus, the output frequency scan appears to be continuous even while the input source is being switched to correspond to the proper drive frequency for each harmonic. If the input source is a varactor oscillator, the discontinuity in the output can be as little as a fraction of a millisecond.

The output of step-recovery diode 196 consists of all of the harmoncis of the input driving source 188. The desired output frequency ($NF_O$) is filtered by YIG filter 198 to eliminate unwanted harmonics. Since the output frequency reference (discriminator 186) is also a YIG device operating at the same frequency it is easy to track them versus frequency. Alternatively, the YIG resonator incorporated in discriminator 186 can be tuned within the same magnetic tuning structure as YIG filter 198 thereby closing the loop around the filter as well as the input source 188.

If the YIG resonator of discriminator 186 is placed before YIG filter 198, then a band-pass approach is needed to select the desired harmonic in the presence of other higher level harmonics. If the YIG resonator used for the discriminator is placed after the output filter, as shown in FIG. 16, then a band-reject approach can be used.

As stated previously the principle of operation of this invention depends on a tunable resonant cavity. Such cavity could be acoustic, optical, electromagnetic, etc. However, as also stated above, it is possible to achieve demodulation where a fixed tuned filter is used and the input signal is either heterodyned by a swept local oscillator or purposefully swept in a manner that is more typically used for sweeping the resonator. Essentially this produces the same discriminator characteristic as scanning the filter.

It will be understood that the foregoing description of the preferred embodiments are not to be considered limiting as to the scope of the invention. Modifications of the disclosed embodiments will occur to those of ordinary skill in the art. The scope of the invention is therefore to be limited only by the appended claims.

I claim:

1. An automatic frequency control system comprising resonator means a variable center frequency, electronically tunable oscillator means, means for coupling a portion of the power output of said oscillator means to said resonator means, means for electroncially providing a relative frequency sweeping over a common predetermined frequency range of the center frequency of said resonator means and said oscillator means frequency, detector means receiving an output from said resonator means, means for comparing the phase of said sweeping means to the output of said detector means to provide an output signal, and means for applying said output signal to said oscillator means to track said electronically tunable oscillator means to said tunable resonator means.

2. The combination of claim 1 wherein said relative sweeping means comprises means for electronically sweeping said resonator means about its center frequency.

3. The combination of claim 1 wherein said relative sweeping means comprises means for electronically sweeping said oscillator means frequency.

4. The combination of claim 2 wherein said oscillator means comprises electronically tunable means for generating a plurality of frequency outputs each covering a different frequency range and wherein said resonator means comprises one or more resonators and each of said frequency outputs is tracked to a single resonator.

5. The combination of claim 4 wherein said plurality of frequency outputs are contiguous in frequency coverage and are selectively tracked to a single resonator whereby frequency discontinuities at the frequency range band edges are minimized.

6. The combination of claim 1 wherein said resonator means comprises a band-pass filter.

7. The combination of claim 1 wherein said resonator means comprises a band-reject filter.

8. The combination of claim 6 wherein said filter means includes a single ferrimagnetic resonator.

9. The combination of claim 7 wherein said filter means includes a single ferrimagnetic resonator.

10. The combination of claim 6 wherein said filter means includes multiple ferrimagnetic resonators.

11. The combination of claim 1 wherein the sweeping means causes a linear frequency excursion.

12. The combination of claim 1 wherein said sweeping means provides a relative sweeping in accordance with a linear sawtooth waveform.

13. The combination of claim 12 further comprising a narrow band filter means for filtering out the fundamental frequency component from the output of said detector means.

14. The combination of claim 8 wherein said ferrimagnetic resonator is tuned by said sweeping means, said sweeping means comprising a coil located in proximity of the magnetic gap of the resonator electromagnet and a current generating means driving said coil.

15. The combination of claim 9 wherein said ferrimagnetic resonator is tuned by said sweeping means, said sweeping means comprising a coil located in proximity to the magnetic gap of the electromagnet and a current generating means driving said coil.

16. The combination of claim 2 wherein the bandwidth of relative sweeping of said resonator means is electronically variable.

17. The combination of claim 4 wherein said resonator means comprises a ferrimagnetic filter tunable over a multi-octave frequency range.

18. The combination of claim 2 wherein the center frequency of said resonator is electronically tunable.

19. The combination of claim 2 wherein the sweeping rate is variable over a wide range from DC to MHz.

20. The combination of claim 2 in a broadband oscillator system wherein said oscillator means comprises a low frequency oscillator means and a harmonic generator means, and wherein said resonator means comprises a ferrimagnetic resonator, the combination further comprising means for coarsely tuning said low frequency oscillator means to selected operating frequencies, and means for accurately tuning said ferrimagnetic resonator to a selected harmonic of low frequency oscillator operating frequency.

21. The combination of claim 20 further comprising RF filter means placed after said harmonic generation means to filter unwanted harmonics.

22. The combination of claim 21 wherein said RF filter means comprises ferrimagnetic filter means.

23. An automatic frequency control system comprising ferrimagnetic resonator means, oscillator means, means for coupling a portion of the power output of said oscillator means to said resonator means, means for electronically sweeping the center frequency of said ferrimagnetic resonator means across said oscillator means frequency, detector means receiving an output from said resonator means, means for comparing phase of said sweeping means to the output of said detector means to provide an output signal, and means for applying said output signal to said oscillator to track said oscillator means to said ferrimagnetic resonator means.

24. The combination of claim 23 wherein said ferrimagnetic resonator means comprises a band-pass filter.

25. The combination of claim 23 wherein said ferrimagnetic resonator means comprises a band-reject filter.

26. The combination of claim 23 wherein said means for electronically sweeping the center frequency of said ferrimagnetic resonator means comprises a coil located in proximity of the magnetic gap of the ferrimagnetic resonator electromagnet and a current generating means driving said coil.

* * * * *

UNITED STATES PATENT OFFICE

CERTIFICATE OF CORRECTION

PATENT NO. : 3,921,085
DATED : November 18, 1975
INVENTOR(S) : William J. Keane

It is certified that error appears in the above-identified patent and that said Letters Patent are hereby corrected as shown below:

Column 1, line 18 "turning" should read -- tuning--.
line 20, "electrically turned" should read -- electronically tuned --.
lines 54-55 "turning" should read -- tuning --.
Column 2, line 2, "turning" should read -- tuning --.
Column 4, line 57, "tuning a current" should read -- tuning current --.
Column 9, line 36, "rejections" should read -- rejection --.
Column 13, line 58, "of single" should read -- of a single--.
line 60, "since" should read -- Since --.
line 64, "filter" should read -- filters --.
Column 14, line 5, "post-turning" should read -- post-tuning --.
Column 15, line 54, "form" should read -- from --.
Column 16, line 13, "YID" should read -- YIG --.
line 59, "combe" should read -- comb --.
Column 17, line 19, "singificant" should read -- significant--.
line 38, "turning" should read -- tuning --.
line 68, "subscarrier" should read -- subcarriers--.
Column 18, line 2, "smplifir" should read -- amplifier --.
line 47, "carier" should read -- carrier --.
line 59, "turning" should read -- tuning --.
line 61, "seeep" should read -- sweep --.

UNITED STATES PATENT OFFICE

CERTIFICATE OF CORRECTION

PATENT NO. : 3,921,085

DATED : November 18, 1975

INVENTOR(S) : William J. Keane

It is certified that error appears in the above-identified patent and that said Letters Patent are hereby corrected as shown below:

Column 20, line 27, "alinged" should read -- aligned --.

Column 21, line 27, "harmoncis" should read -- harmonics --.

line 63, "means a" should read -- means having a --.

Signed and Sealed this

Third Day of August 1976

[SEAL]

*Attest:*

RUTH C. MASON
*Attesting Officer*

C. MARSHALL DANN
*Commissioner of Patents and Trademarks*